(12) United States Patent
Hale et al.

(10) Patent No.: US 12,032,004 B2
(45) Date of Patent: Jul. 9, 2024

(54) CURRENT DETECTION DEVICE AND RELATED DEVICES, SYSTEMS AND METHODS THEREOF

(71) Applicant: Basis NZ Limited, Auckland (NZ)

(72) Inventors: Brendon David Hale, Christchurch (NZ); Warren Gordon Pettigrew, Christchurch (NZ); Ian Palmer, Christchurch (NZ)

(73) Assignee: Basis NZ Limited, Auckland (NZ)

( * ) Notice: Subject to any disclaimer, the term of this patent is extended or adjusted under 35 U.S.C. 154(b) by 0 days.

(21) Appl. No.: 18/390,382

(22) Filed: Dec. 20, 2023

(65) Prior Publication Data

US 2024/0118319 A1    Apr. 11, 2024

Related U.S. Application Data

(63) Continuation of application No. 18/471,805, filed on Sep. 21, 2023, now abandoned.

(30) Foreign Application Priority Data

Sep. 21, 2022 (AU) ................................. 2022902734
Sep. 20, 2023 (AU) ................................. 2023903034

(51) Int. Cl.
  *G01R 15/20*     (2006.01)
  *G01R 19/00*     (2006.01)

(52) U.S. Cl.
  CPC ....... *G01R 15/202* (2013.01); *G01R 19/0092* (2013.01)

(58) Field of Classification Search
  CPC ........................... G01R 15/202; G01R 19/0092
  (Continued)

(56) References Cited

U.S. PATENT DOCUMENTS 5,475,301 A * 12/1995 Kawakami ........... G01R 15/185
                                                         324/117 R
6,844,799 B2    1/2005 Attarian et al.
(Continued)

FOREIGN PATENT DOCUMENTS

CN        101339206 B      7/2011
CN        106950515 B  * 10/2018  ........... G01R 15/183
(Continued)

*Primary Examiner* — Tung X Nguyen
*Assistant Examiner* — Robert P Alejnikov, Jr.
(74) *Attorney, Agent, or Firm* — Kolitch Romano Dascenzo Gates LLC; Ian D. Gates

(57) ABSTRACT

A current detection device for measuring current flowing through a conductor having a magnetic core having a channel for receiving the conductor therethrough, and a magnetic field transducer positioned at least partially within an air gap of the magnetic core. The magnetic field transducer is configured to respond to the presence of a magnetic field by generating an output electrical signal based on a flux density of the magnetic field. The magnetic core comprises an absolute saturation flux density that is substantially lower than an absolute saturation flux density of the magnetic field transducer. Accordingly, a response of the current detection device within the magnetic flux density operating range varies in sensitivity and is substantially non-linear. The response of the current detection device is preconfigured. The current detection device may be implemented in devices and systems where a substantially wide sensing range and relatively high, low-current sensitivity is desired.

29 Claims, 12 Drawing Sheets

(58) Field of Classification Search
USPC .......................................................... 324/126
See application file for complete search history.

(56) References Cited

U.S. PATENT DOCUMENTS

| | | | |
|---|---|---|---|
| 7,205,757 B2 * | 4/2007 | Itoh ...................... | G01R 15/202 |
| | | | 324/117 R |
| 7,265,531 B2 * | 9/2007 | Stauth ................... | G01R 15/202 |
| | | | 324/126 |
| 7,411,382 B2 | 8/2008 | Tanizawa et al. | |
| 7,936,164 B2 | 5/2011 | Doogue et al. | |
| 11,480,590 B2 | 10/2022 | Racz et al. | |
| 2008/0186021 A1 | 8/2008 | Hashio et al. | |
| 2013/0187633 A1 * | 7/2013 | Yasui ................... | G01R 15/185 |
| | | | 324/117 R |
| 2014/0266240 A1 | 9/2014 | Haensgen et al. | |
| 2020/0182921 A1 | 6/2020 | Jakupi et al. | |

FOREIGN PATENT DOCUMENTS

| | | | | |
|---|---|---|---|---|
| CN | 110954735 A | * | 4/2020 | ........... G01R 15/185 |
| CN | 114424070 A | | 4/2022 | |
| EP | 2515125 B1 | | 10/2012 | |
| JP | 7218552 A | | 8/1995 | |
| JP | 2005345446 A | | 12/2005 | |
| JP | 2007171156 A | | 7/2007 | |
| JP | 2014006181 A | | 1/2014 | |
| JP | 2015083942 A | | 4/2015 | |
| JP | 6119296 B2 | | 4/2017 | |
| WO | WO-2013175865 A1 | * | 11/2013 | ........... G01R 15/202 |

* cited by examiner

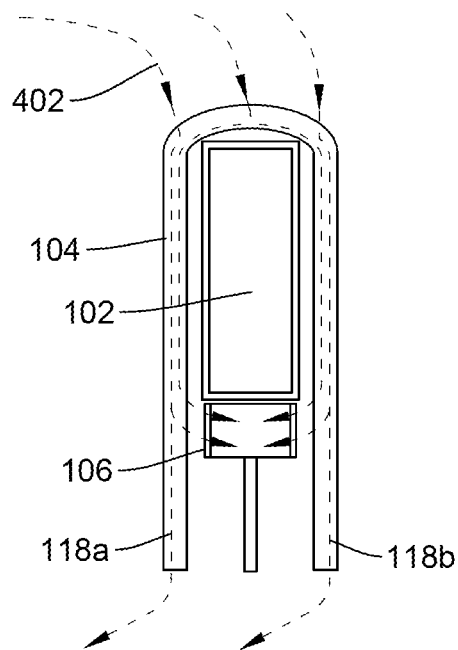
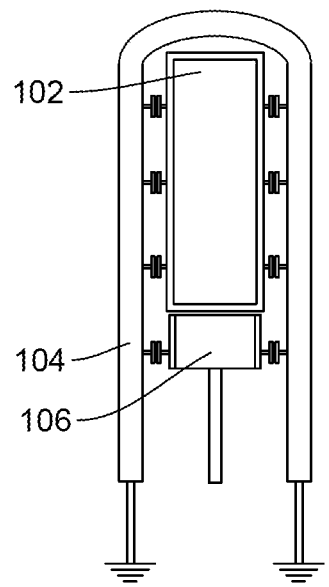
FIG. 4A    FIG. 4B
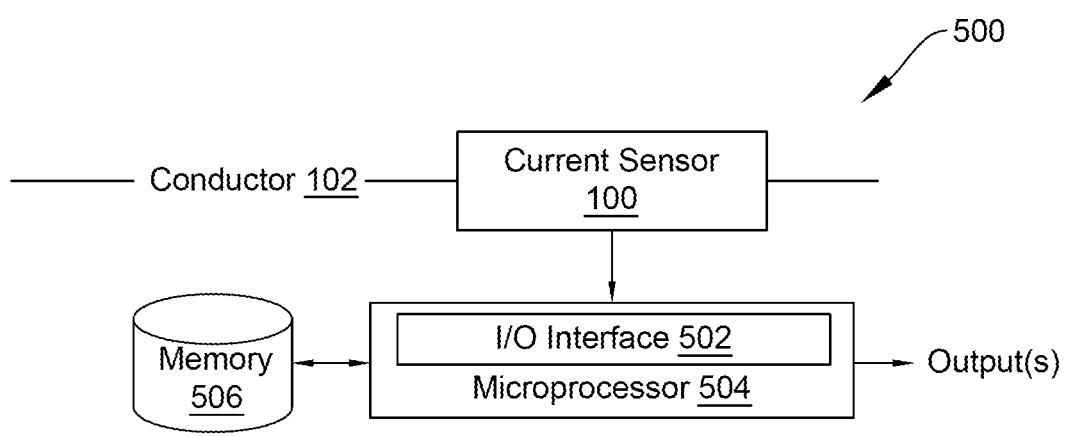
FIG. 5

CURRENT DETECTION DEVICE AND RELATED DEVICES, SYSTEMS AND METHODS THEREOF

RELATED APPLICATIONS

The present application is a continuation of, and claims priority under 35 U.S.C. § 120 to, U.S. patent application Ser. No. 18/471,805, which was filed on Sep. 21, 2023, which is entitled "CURRENT DETECTION DEVICE AND RELATED DEVICES, SYSTEMS AND METHODS THEREOF," and which claims priority under 35 U.S.C. § 119 to Australia Patent Application No. 2022902734, which was filed on Sep. 21, 2022, and to Australia Patent Application No. 2023903034, which was filed on Sep. 20, 2023. The complete disclosures of these related applications and any patents issued therefrom are hereby incorporated by reference.

FIELD

The present disclosure relates to electrical current detection devices, and to related circuits, devices, systems and/or methods thereof.

BACKGROUND

Different types of current sensors currently exist for measuring electrical current through a conductor. Such sensors may operate by concentrating and transducing a magnetic field generated by the current in the conductor. A Hall effect current sensor, for example, comprises a gapped magnetic field concentrator (often referred to as the "magnetic core") and a Hall effect device positioned within the gap. A current-carrying conductor, such as a wire, is passed through the centre of the magnetic core and fixed in position relative to the core. This type of sensor measures current flowing through the conductor by concentrating a magnetic field generated by the current onto the Hall effect device. The Hall effect device transduces the sensed magnetic flux density into an output voltage signal indicative of the current. This is one example of many available types of current sensors.

Various parameters can characterise the performance and suitability of a current sensor for a particular application. For example, linearity of a current sensor, which reflects how consistently the output signal varies in direct proportion to the current through the conductor, is a primary design consideration for most applications. High linearity greatly simplifies interpreting the output signal of the sensor and achieving high accuracy systems. The sensitivity or resolution of a current sensor, which reflects the degree of change in the output signal (e.g., Volts) in response to one unit of change through the current carrying conductor (e.g., one ampere or one tesla), is another important design consideration. The sensor's operating range, defined by the minimum and maximum current/magnetic flux density magnitudes that the sensor is capable of measuring with an acceptable degree of accuracy, is another important application-dependent consideration.

Linearity, sensitivity, and sensing range are all operating parameters that need to be balanced by other application dependent requirements including, for instance, physical size and geometry of the sensor, the hardware real-estate available for mounting the sensor, as well as the cost and complexity to manufacture. To give an example, achieving a high sensitivity current sensor with a wide sensing range, typically involves using a relatively large magnetic core formed from high-quality magnetic materials, which can affect both the cost to manufacture and the hardware footprint of the sensor.

The sensor's frequency response, susceptibility to stray magnetic fields and external magnetic noise, are also considerations which may have varying degrees of importance depending on the application and that can affect the design and complexity of a sensor.

As technology continues to advance, there is a growing need to digitalise, monitor and control the functionality of electrical systems, and current sensors play a vital role in enabling this transformation. Accordingly, there is also a growing need to provide alternative current sensing devices and methods that may be suited for some applications over others.

SUMMARY

Current detection devices for measuring current flowing through a conductor comprise a magnetic core having a channel for receiving the conductor therethrough, and a magnetic field transducer positioned at least partially within an air gap of the magnetic core. The magnetic field transducer is configured to respond to the presence of a magnetic field by generating an output electrical signal based on a flux density of the magnetic field. The magnetic core comprises an absolute saturation flux density that is substantially lower than an absolute saturation flux density of the magnetic field transducer.

BRIEF DESCRIPTION OF THE DRAWINGS

FIG. 4A is a cross-section view of the current detection device of FIG. 1A, showing the shielding effects of the current detection device.

FIG. 4B is a cross-section view of the current detection device of FIG. 1A, showing the effects of electronic grounding on the current detection device.

FIG. 5 is a block diagram illustrating an embodiment of the present disclosure comprising a circuit or device incorporating any one of the current detection device embodiments of the present disclosure.

DETAILED DESCRIPTION

Figure 1A:
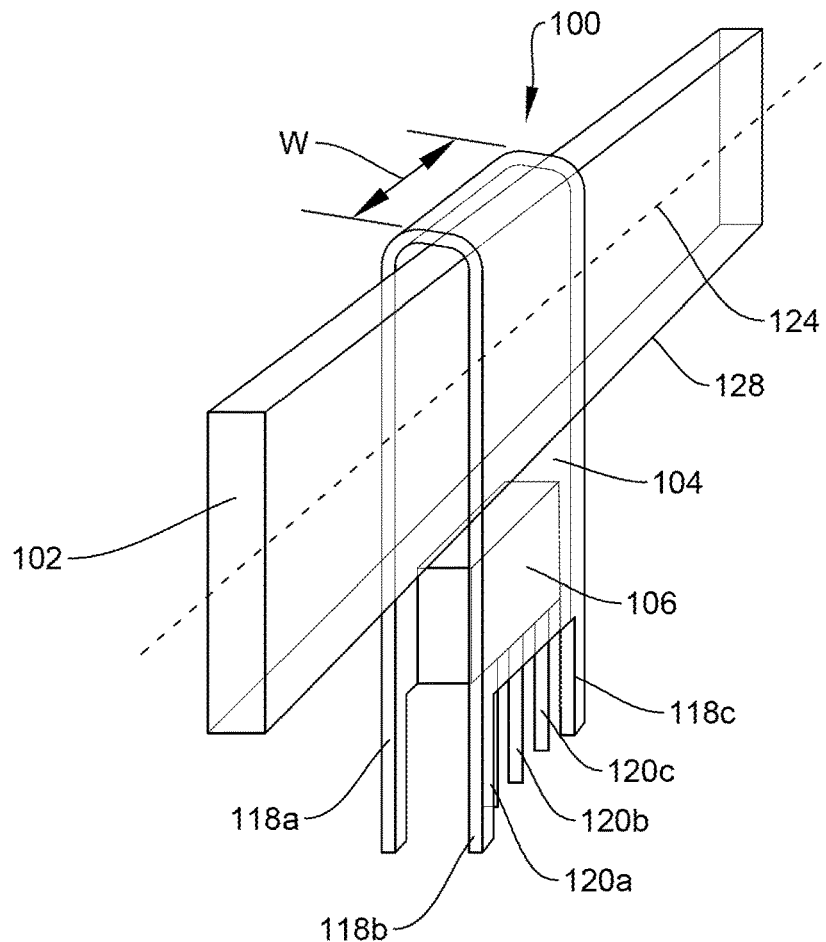
FIG. 1A is a perspective view of an embodiment of the present disclosure comprising a current detection device.

In the following description, specific details are given to provide a thorough understanding of the embodiments. However, it will be understood by one of ordinary skill in the art that the embodiments may be practiced without these specific details. For example, software modules, functions, circuits, etc., may be shown in block diagrams in order not to obscure the embodiments in unnecessary detail. In other instances, well-known modules, structures, and techniques may not be shown in detail in order not to obscure the embodiments.

It is an object of the present disclosure to provide an alternative current detection device, or method, which goes in some way toward addressing the above-mentioned need, or that at least provides the public with a useful choice.

In this specification where reference has been made to patent specifications, other external documents, or other sources of information, this is generally for the purpose of providing a context for discussing the features of the present disclosure. Unless specifically stated otherwise, reference to such external documents is not to be construed as an admission that such documents, or such sources of information, in any jurisdiction, are prior art, or form part of the common general knowledge in the art.

In an aspect, the present disclosure may broadly be said to comprise a current detection device for measuring current flowing through a conductor, with the current detection device comprising:

a magnetic core having a channel for receiving the conductor therethrough, and
a magnetic field transducer positioned at least partially within an air gap of the magnetic core, and configured to respond to the presence of a magnetic field by generating an output electrical signal based on a flux density of the magnetic field,
wherein the magnetic core comprises an absolute saturation flux density that is substantially lower than an absolute saturation flux density of the magnetic field transducer.

In an embodiment:
the magnetic field transducer comprises a magnetic flux density operating range defined by a minimum saturation flux density and a maximum saturation flux density, beyond which the generated output electrical signal of the magnetic field transducer is substantially saturated, and
a response of the current detection device within the magnetic flux density operating range varies in sensitivity, the response of the current detection device being a response of the output electrical signal in response to a current in the conductor.

In an embodiment, the response of the current detection device is preconfigured.

In an embodiment, a sensitivity of the current detection device is substantially higher in a lower magnetic flux density response zone relative to a higher magnetic flux density response zone, within the operating range of the magnetic field transducer.

In an embodiment, a response of the current detection device within the operating range comprises a substantially non-linear response zone.

In an embodiment, the non-linear response zone is a substantially curved response zone.

In an embodiment, the response of the current detection device further comprises a substantially linear, lower response zone, below a minimum absolute flux density of the non-linear response zone.

In an embodiment, the response of the current detection device further comprises a substantially linear, upper response zone above a maximum absolute flux density of the non-linear response zone.

In an embodiment, the upper response zone is below the absolute saturation flux density of the magnetic field transducer.

In an embodiment, the absolute saturation flux density of the magnetic core is less than approximately 50% of the absolute saturation flux density of the magnetic field transducer.

In an embodiment, the absolute saturation flux density of the magnetic core is less than approximately 25% of the absolute saturation flux density of the magnetic field transducer.

In an embodiment, the absolute saturation flux density of the magnetic core is less than approximately 10% of the absolute saturation flux density of the magnetic field transducer.

In an embodiment, the absolute saturation flux density of the magnetic core is more than approximately 5% of the absolute saturation flux density of the magnetic field transducer.

In an embodiment, the magnetic core is formed predominantly from a soft-magnet material or materials.

In an embodiment, the absolute saturation flux density of the magnetic core is between approximately 0.1 mT and approximately 500 mT.

In an embodiment, the absolute saturation flux density of the magnetic core is between approximately 1 mT and approximately 10 mT.

In an embodiment, the absolute saturation flux density of the magnetic core is between approximately 1 mT and approximately 5 mT.

In an embodiment, the absolute saturation flux density of the magnetic field transducer is between approximately 1 mT and approximately 500 mT.

In an embodiment, the absolute saturation flux density of the magnetic field transducer is between approximately 5 mT and approximately 250 mT.

In an embodiment, the absolute saturation flux density of the magnetic field transducer is between approximately 10 mT and approximately 150 mT.

In an embodiment, the magnetic core comprises a mu-metal material or materials.

In an embodiment, the magnetic core comprises a nanocrystalline material or materials.

In an embodiment, the magnetic core is formed from a single layer of magnetic material or materials.

In an embodiment, the magnetic core comprises a plurality of layers of a magnetic material or materials.

In an embodiment, the layers comprise a same magnetic material(s).

In an embodiment, the layers comprise two or more layers of different magnetic material(s).

In an embodiment, the magnetic core comprises 8 layers of magnetic material(s) or less, or 6 layers of magnetic material(s) or less, or 4 layers of magnetic material(s) or less.

In an embodiment, the magnetic core comprises a substantially U-shaped cross-section.

In an embodiment, the magnetic core comprises at least two opposing sharp corners at a substantially closed end of the core.

In an embodiment, wherein the air gap locates between two opposing walls of the magnetic core, at an open end or side of the magnetic core.

In an embodiment, a distance between two opposing inner walls of the magnetic core at the air gap is substantially uniform across a region of the air gap containing the magnetic field transducer.

In an embodiment, the magnetic field transducer comprises one or more magnetic field transducing devices, each configured to generate an electrical signal in the presence of a magnetic field, and wherein each magnetic field transducing device is positioned substantially entirely within the air gap of the magnetic core.

In an embodiment, the magnetic field transducer comprises multiple magnetic field transducing devices and the magnetic field transducer is configured to output multiple electrical signals corresponding to the flux densities detected at the multiple magnetic field transducing devices.

In an embodiment, the magnetic field transducer comprises multiple magnetic field transducing devices and the magnetic field transducer is configured to output an electrical signal corresponding to a combined or differential flux density detected at the multiple magnetic field transducing devices.

In an embodiment, the channel for receiving the conductor is substantially narrow or thin.

In an embodiment, the magnetic field transducer is positioned directly adjacent a narrow side of the conductor, in situ.

In an embodiment, the magnetic field transducer is positioned directly adjacent a major side or face of the conductor, in situ.

In an embodiment, the magnetic field transducer comprises at least one Hall effect device or element.

In an embodiment, the magnetic field transducer comprises at least one magnetoresistive device or element.

In an embodiment, the magnetic field transducer comprises at least two closely associated magnetic field transducing devices or elements located within the air gap, the magnetic field transducing devices or elements being configured to be exposed to a same or similar input magnetic flux density.

In an embodiment, the magnetic field transducer comprises at least two magnetic field transducing devices or elements located within the air gap, each magnetic field transducing device having a different absolute saturation flux density.

In an embodiment, each magnetic field transducing device comprises a different sensitivity with respect to an output electrical signal generated by the magnetic field transducing device, in the presence of a magnetic field.

In an embodiment, the magnetic field transducer comprises at least one pair of magnetic field transducing devices or elements oriented to output electrical signals having opposing polarities with respect to the direction of a common magnetic field.

In an embodiment, the magnetic field transducing devices or elements are electrically connected to a summing circuit for outputting a differential electrical current signal.

In an embodiment, each pair of magnetic field transducing devices or elements face in opposing directions with respect to a common magnetic field.

In an embodiment, the outputs of each pair of magnetic field transducing devices or elements are electrically connected to a common summing amplifier.

In an embodiment, the device further comprises a measurement device configured to receive at least one input electrical signal indicative of at least one output of the magnetic field transducer, and determine an indication of a current in the conductor based on the received electrical signal(s).

In an embodiment, the measurement device comprises at least one processing device, and at least one electronic storage medium having stored therein measurement instructions for determining an indication of the current in the conductor based on data indicative of the input electrical signal(s) received by the measurement device.

In an embodiment, the electrical signal(s) output by the magnetic field transducer comprises a differential current signal indicative of the differential magnetic flux density sensed by a pair of magnetic field transducers or elements of the magnetic field transducer.

In an embodiment, the electrical signal(s) output by the magnetic field transducer comprises a pair of output signals, each indicative of the magnetic flux density sensed by a respective magnetic field transducing device of the magnetic field transducer.

In an embodiment, the instructions configure the processing device(s) to determine an indication of the current in the conductor based on data indicative of a differential magnetic flux density sensed by multiple magnetic field transducers or elements of the magnetic field transducer.

In an embodiment, the instructions configure the processing device to determine data indicative of the current in the conductor based on a predetermined response of current detection device.

In an embodiment, the magnetic core comprises a U-shaped cross-section.

In an embodiment, the magnetic core comprises a pair of spaced opposing walls connected at one end and open at another end.

In an embodiment, the opposing walls are substantially planar.

In an embodiment, the opposing walls are substantially parallel to one another.

In an embodiment, the magnetic core comprises an open channel between the opposing walls for receiving a conductor therethrough, in use.

In an embodiment, the open channel is substantially narrow in thickness, and extends along two axes substantially orthogonal to the thickness for receiving a substantially thin and planar conductor.

In an embodiment, the opposing walls are substantially thin.

In an embodiment, the opposing walls each comprise a substantially uniform thickness along a longitudinal length of each wall.

In an embodiment, the spaced opposing walls comprise an air gap therebetween.

In an embodiment, the magnetic body comprises a substantially uniform gap between the opposed walls along a longitudinal length of each wall.

In an embodiment, the gap is substantially uniform along an entire length of each wall.

In an embodiment, a distance between the opposing walls at an open end of the opposing walls is substantially the same as a distance between the opposing walls at or adjacent to a closed end of the walls.

In an embodiment, a distance between the opposing walls at an open end of the opposing walls is substantially lower than as a distance between the opposing walls adjacent a closed end of the walls.

In an embodiment, each wall is substantially elongated.

In an embodiment, the magnetic core comprises a substantially planar sheet that is bent along a substantially central axis of the planar sheet.

In an embodiment, the magnetic core comprises a substantially uniform thickness.

In an embodiment, a maximum thickness of each wall in a planar section of the wall is between approximately 0.005 and 0.5 times a width of the wall in the planar section.

In an embodiment, the magnetic core comprises at least one grounding leg extending laterally from a terminal end of at least one of the opposing walls.

In an embodiment, a pair of opposing grounding legs extend laterally from either side of each opposing wall at a terminal end of the wall.

In an embodiment, a magnetic field transducer comprises one or more magnetic field transducing devices or elements and each magnetic field transducer element or device is accommodated substantially wholly between a pair of opposing walls of the magnetic core.

In an embodiment, the magnetic field transducer locates between opposing walls of the magnetic core at a terminal, open end of the opposing walls.

In an embodiment, the channel for receiving the conductor is substantially elongated along a longitudinal axis of the channel, and the magnetic field transducer is located at an end of the channel along the longitudinal axis.

In an embodiment, the end of the channel is an open end of the channel.

In an embodiment, the magnetic field transducer comprises at least one magnetic field transducing element.

In an embodiment, the magnetic field transducer comprises at least one Hall element located within the magnetic core channel.

In an embodiment, the Hall elements are closely associated and configured to be exposed to a same or similar input magnetic flux density.

In an embodiment, each Hall element comprises a different input saturation flux density.

In an embodiment, the magnetic field transducer including the at least two Hall elements is entirely located within the channel of the common magnetic core.

In an embodiment, the magnetic field transducer locates within a general plane central to the channel and non-intersecting with opposing walls of the magnetic core bounding the channel.

In an embodiment, the current sensor is configured such that, during operation, an electrical signal output by the magnetic field transducer is indicative of a current flowing through the conductor, and a sensitivity of the electrical signal reduces with increasing current flowing through the conductor.

In an embodiment, the sensitivity reduces non-linearly.

In another aspect, the present disclosure may broadly be said to comprise a current detection device comprising:
a magnetic core having a channel for receiving a conductor therethrough, and
a magnetic field transducer located at least partially within an air gap of the magnetic core and configured to respond to the presence of a magnetic field by generating an electrical signal based on a flux density of the magnetic field,
wherein the current detection device comprises a magnetic flux density operating range defined by a minimum magnetic flux density and a maximum magnetic flux density, beyond which an output electrical signal of the current sensor is substantially saturated, and wherein a response within the magnetic flux density operating range varies in sensitivity.

In an aspect, the present disclosure may broadly be said to comprise a device, comprising:
a current detection device as claimed in any one of the previous aspects, configured to output an electrical signal indicative of a current through a conductor; and
a controller configured to receive an input signal indicative of the electrical signal output from the current detection device, and generate an indication of a current through the conductor based on the input signal(s) and based on a predetermined response of the output signal from the current detection device in response to current flowing through the conductor.

In another aspect, the present disclosure may broadly be said to comprise a device comprising:
a current detection device configured to output an electrical signal indicative of a current through a conductor; and
a controller configured to receive an input signal indicative of the electrical signal output from the current detection device, and generate an indication of a current through the conductor based on the input signal(s) and based on a predetermined response of the output signal from the current detection device in response to current flowing through the conductor, the response varying in sensitivity across a magnetic flux density operating range of the current detection device.

In an embodiment, the current detection device response is substantially non-linear.

In an embodiment, the substantially non-linear response zone is a substantially curved response zone.

In an embodiment, the response of the current detection device further comprises at least two substantially linear response zone with varying sensitivities, including an inner response zone at a current range below a current range corresponding to the substantially non-linear response zone and upper response zone at a current range above the current range corresponding to the substantially non-linear response zone.

In an embodiment, the inner response zone and the upper response zone each correspond to a sensitivity of the current detection device that is greater than a sensitivity of the current sensor at input magnetic flux densities at or beyond a saturation flux density of the current sensor.

In an embodiment, the device is configured to perform one of multiple functions, and wherein a first function is performed based on an electrical signal output from the current sensor corresponding to the lower response zone, and a second function is performed based on an electrical signal output from the current sensor corresponding to the substantially non-linear response zone or the upper response zone.

In an embodiment, the first function is a circuit monitoring function in which the device is configured to store or transmit data indicative of the output electrical current.

In an embodiment, the device further comprises an electrical current flow path configured to connect to a source of electrical power and to an electrical load, and wherein the device is configured to store or transmit data indicative of current flowing through the current flow path based on the electrical signal output from the current detection device.

In an embodiment, the second function is a protective function in which the device is configured to send a protective control signal based on data indicative of the output electrical current.

In an embodiment, the device further comprises an electrical current flow path configured to connect between a source of electrical power and an electrical load, and a disconnect means electrically connected to the electrical current flow path, and wherein the protective control signal is configured to actuate the disconnect means to open the electrical current flow path.

In an embodiment, the response of the current detection device comprises a response of single magnetic field transducing device of the current sensor.

In an embodiment, the response of the current sensor comprises a combined response of multiple magnetic field transducers or elements of the current detection device.

In an embodiment, the response of the current sensor comprises a differential response of multiple magnetic field transducers or elements of the current detection device.

In an embodiment, the device further comprises a conductor operatively coupled to the current detection device.

In an embodiment, the conductor is a busbar.

In an embodiment, the conductor is substantially planar and elongated and a magnetic field transducer of the current sensor locates adjacent an edge of the conductor.

In an embodiment, the magnetic field transducer is located within opposing edges of a face of a conductor.

In an embodiment, the face is a narrow face of the conductor.

In an embodiment, the magnetic field transducer is located adjacent a major face of the conductor.

In an embodiment, the controller comprises at least one electronic storage medium storing the predetermined response.

In an embodiment, the controller is configured to determine a fault condition based on the indication of the current through the conductor.

In an embodiment, the controller is configured to generate a first control signal based on the indication of the current.

In an embodiment, the device further comprises an electrical current flow path between a source of electrical power and an electrical load, and a disconnect means electrically connected to the electrical current flow path, and wherein the control signal is configured to actuate the disconnect means.

In an embodiment, the device comprises an electrical current flow path between a source of electrical power and an electrical load and wherein the device is configured to store or transmit data indicative of current flowing through the current flow path based on the electrical signal output from the current detection device.

In an embodiment, the non-linear response comprises at least one substantially linear response component within the range of operation.

In an embodiment, the output electrical signal response comprises at least two distinct and substantially linear response components within the range of operation.

In an embodiment, the multiple distinct and substantially linear response components comprise varying sensitivities.

In an embodiment, the output electrical signal response comprises a first substantially linear component corresponding to a lower conductor current range, and a second linear component corresponding to a higher conductor current range.

In an embodiment, the first substantially linear component comprises a relatively greater sensitivity than the second substantially linear component.

In an embodiment, the second substantially linear response component comprises a gradient greater than zero.

In an embodiment, the second substantially linear response component comprises a gradient that is greater than a current sensor response when the current sensor is substantially fully saturated.

In an embodiment, the second linear component corresponds to at least approximately 25% of the full range of operation of the magnetic field transducer.

In an embodiment, the second linear component corresponds to at least approximately 50% of the full range of operation of the magnetic field transducer.

In an embodiment, the second linear component corresponds to at least approximately 80% of the full range of operation of the magnetic field transducer.

In an embodiment, the first linear response component and the second linear response component correspond to non-overlapping current ranges.

In an embodiment, the magnetic field transducer comprises at least two Hall elements located within the magnetic core channel.

In an embodiment, the Hall elements are closely associated and configured to be exposed to a same or similar input magnetic flux density.

In an embodiment, each Hall element comprises a different input saturation flux density.

In an embodiment, the magnetic field transducer including the at least two Hall elements is entirely located within the channel of the common magnetic core.

In an aspect, the present disclosure may broadly be said to comprise a current monitoring circuit or device, comprising:

a current sensor configured to output an electrical signal indicative of a current through a conductor; and a monitoring device configured to receive an input signal indicative of the electrical signal output from the current sensor, and generate an indication of a current through the conductor based on the input signal and based on a predetermined non-linear response of the current sensor's output signal to a current flowing through a conductor coupled to the current sensor.

In an embodiment, the circuit or device further comprises a conductor operatively coupled to the sensor.

In an embodiment, the conductor is substantially planar and elongated and a magnetic field transducer of the current sensor locates adjacent an edge of the conductor.

In an embodiment, the magnetic field transducer locates substantially within an imaginary plane containing a central plane of the planar conductor.

In an embodiment, the conductor is electrically isolated from a magnetic core of the current sensor.

In an embodiment, the circuit or device further comprises at least one non-conductive layer disposed or coupled about an outer surface of the conductor to electrically isolate the conductor from the magnetic core.

In an embodiment, a magnetic core of the current sensor forms a substantially close but spaced fit over the conductor.

In an embodiment, the current monitoring device comprises at least one processor configured to generate the indication of the current.

In an embodiment, the processor is further configured to determine a value of a current flowing through the conductor received within the magnetic core, from the input signal.

In an embodiment, the current monitoring device comprises electronic memory storing the predetermined response.

In an embodiment, the current monitoring device is configured to determine a fault condition based on the indication of the current through the conductor.

In an aspect, the present disclosure may broadly be said to comprise a method for manufacturing a current sensor comprising the step of coupling a magnetic field transducer at least partially within a channel of a magnetic core, wherein the magnetic core is configured to magnetically saturate at a lower magnetic flux density relative to the magnetic field transducer.

In an aspect, the present disclosure may broadly be said to comprise a current sensor comprising:
 a magnetic core having a channel for receiving a conductor therethrough, and
 a magnetic field transducer located at least partially within the channel and configured to output an electrical signal based on a flux density generated at an input of the magnetic field transducer, the magnetic field transducer having at least two Hall elements located within the magnetic core channel.

In an embodiment, the Hall elements are closely associated and configured to be exposed to a same or similar input magnetic flux density.

In an embodiment, each Hall element comprises a different input saturation flux density.

In an embodiment, the magnetic field transducer including the at least two Hall elements is entirely located within the channel of the common magnetic core.

In an aspect, the present disclosure may broadly be said to comprise a current monitoring circuit or device, comprising:
 a current sensor configured to output an electrical signal indicative of a current through a conductor, the current sensor having a magnetic core having a channel for receiving the conductor therethrough, and a magnetic field transducer located at least partially within the channel and configure to output an electrical signal based on a flux density generated at an input of the magnetic field transducer, the magnetic field transducer having at least two Hall elements located within the magnetic core channel; and
 a monitoring device configured to receive an input signal indicative of the electrical signal output from the current sensor, and generate an indication of a current through the conductor based on the input signal.

In an embodiment, the Hall elements are closely associated and configured to be exposed to a same or similar input magnetic flux density.

In an embodiment, each Hall element comprises a different input saturation flux density.

In an aspect, the present disclosure may broadly be said to comprise a method for manufacturing a channel of a magnetic core, wherein the magnetic core comprises at least two Hall elements.

In an aspect, the present disclosure may broadly be said to comprise a current sensor comprising:
 a magnetic core having a channel for receiving a conductor therethrough, and
 a magnetic field transducer located at least partially within the channel and configured to output an electrical signal based on a flux density generated at an input of the magnetic field transducer,
 wherein the magnetic core is configured to magnetically saturate at a lower magnetic flux density relative to the magnetic field transducer.

In an aspect, the present disclosure may broadly be said to comprise a current sensor comprising:
 a magnetic core having a channel for receiving a conductor therethrough, and
 a magnetic field transducer located at least partially within the channel and configured to output an electrical signal based on a magnetic flux density generated at an input of the magnetic field transducer,
 wherein, during operation, a response of the output electrical signal to a current flowing through the conductor is substantially non-linear within a range of operation excluding magnetic saturation of the magnetic field transducer.

In an aspect, the present disclosure may broadly be said to comprise a device, comprising:
 a current detection device configured to output an electrical signal indicative of a current through a conductor; and
 a controller configured to receive an input signal indicative of the electrical signal output from the current detection device sensor, and generate an indication of a current through the conductor based on the input signal and based on a predetermined response of an output signal from the current detection device in response to current flowing through the conductor, the response being substantially non-linear within a magnetic flux density operating range of the current detection device.

In an aspect, the present disclosure may broadly be said to comprise a current detection device for measuring current flowing through a conductor comprising:
 a magnetic core having a channel for receiving the conductor therethrough, and
 one or more magnetic field transducing devices positioned at least partially within an air gap of the magnetic core, and configured to respond to the presence of a magnetic field by generating an output electrical signal based on a flux density of the magnetic field, wherein the magnetic core comprises an absolute saturation flux density that is substantially lower than an absolute saturation flux density of at least one of the magnetic field transducing devices.

In an aspect, the present disclosure may broadly be said to comprise a current detection device comprising:
a magnetic core having a channel for receiving a conductor therethrough, and
at least one magnetic field transducing device located at least partially within an air gap of the magnetic core and configured to respond to the presence of a magnetic field by generating one or more electrical signal(s) based on a flux density of the magnetic field,
wherein the current detection device comprises a magnetic flux density operating range defined by a minimum magnetic flux density and a maximum magnetic flux density, beyond which the output electrical signal(s) of the current detection device is(are) substantially saturated, and wherein a response of at least one of the output electrical signal(s) within the magnetic flux density operating range varies in sensitivity.

In an aspect, the present disclosure may broadly be said to comprise a current detection device comprising:
a magnetic core having a channel for receiving a conductor therethrough, and
at least one magnetic field transducing device located at least partially within an air gap of the magnetic core and configured to respond to the presence of a magnetic field by generating one or more electrical signal(s) based on a flux density of the magnetic field,
wherein the current detection device comprises a magnetic flux density operating range defined by a minimum magnetic flux density and a maximum magnetic flux density, beyond which the output electrical signal(s) of the current detection device is(are) substantially saturated, and wherein a response of at least one of the output electrical signal(s) within the magnetic flux density is substantially non-linear.

In an aspect the present disclosure may broadly be said to comprise a device, comprising:
a current detection device configured to output one or more electrical signal(s) indicative of a current through a conductor; and
a controller configured to receive one or more input signal(s) indicative of the electrical signal(s) output from the current detection device, and generate an indication of a current through the conductor based on the input signal(s) and based on a predetermined response of the one or more signal(s) output from the current detection device in response to current flowing through the conductor, the response varying in sensitivity across a magnetic flux density operating range of the current detection device.

In an aspect, the present disclosure may broadly be said to comprise a device, comprising:
a current detection device sensor configured to output one or more electrical signal(s) indicative of a current through a conductor; and
a controller configured to receive one or more input signal(s) indicative of the one or more electrical signal(s) output from the current detection device, and generate an indication of a current through the conductor based on the input signal(s) and based on a predetermined response of the one or more signal(s) output from the current detection device in response to current flowing through the conductor, the response being substantially non-linear within a magnetic flux density operating range of the current detection device.

The features of any one or more of the above embodiments relating to any one of the above device, system or circuit related aspects, can be combined with any one or more other embodiments or aspects described in this section of the patent specification.

In an aspect, the present disclosure may broadly be said to comprise a method comprising the steps of:
receiving an input signal indicative of an electrical signal output from a current detection device, and
determining an indication of a current based on the input signal(s) and based on a predetermined response of an output signal from the current detection device, the predetermined response varying in sensitivity across a magnetic flux density operating range of the current detection device.

In an embodiment, the response is substantially non-linear.

In an embodiment, the substantially non-linear response zone is a substantially curved response zone.

In an embodiment, the response of the current detection device further comprises at least two substantially linear response zone with varying sensitivities, including an inner response zone at a current range below a current range corresponding to the substantially non-linear response zone and upper response zone at a current range above the current range corresponding to the substantially non-linear response zone.

In an embodiment, the inner response zone and the upper response zone each correspond to a sensitivity of the current detection device that is greater than a sensitivity of the current detection device at input magnetic flux densities at or beyond a saturation flux density of the current detection device.

In an embodiment, the method further comprises the step of performing one of multiple functions, and wherein a first function is performed based on an electrical signal output from the current sensor corresponding to the lower response zone, and a second function is performed based on an electrical signal output from the current detection device corresponding to the substantially non-linear response zone or the upper response zone.

In an embodiment, the method further comprises determining a combined current corresponding to the output of multiple magnetic field transducers or elements of the current detection device, and the predetermined response is indicative of a combined response of multiple magnetic field transducers or elements of the current detection device.

In an embodiment, the method further comprises determining a differential current corresponding to the output of multiple magnetic field transducers or elements of the current sensor, and the predetermined response is indicative of a differential response of multiple magnetic field transducers or elements of the current detection device.

In an aspect, the present disclosure may broadly be said to comprise a method for measuring a current through a conductor, the method comprising the steps of:
receiving an input signal indicative of an electrical signal output from a current sensor, and
determining an indication of a current through the conductor based on the input signal and based on a predetermined non-linear response of the current sensor's output signal relative to a current through a conductor coupled to the current sensor.

In an embodiment, the non-linear response comprises at least one substantially linear response component within the range of operation.

In an embodiment, the current sensor's output signal response comprises at least two distinct and substantially linear response components within the range of operation.

In an embodiment, the multiple distinct and substantially linear response components comprise varying gradients.

In an embodiment, the current sensor's output signal response comprises a first substantially linear component corresponding to a lower conductor current range, and a second linear component corresponding to a higher conductor current range.

In an embodiment, a gradient of the first substantially linear component is substantially greater than the gradient of the second substantially linear component.

In an embodiment, the second substantially linear response component comprises a gradient greater than zero.

In an embodiment, the second substantially linear response component comprises a gradient that is greater than a current sensor response when the current sensor is substantially fully saturated.

In an embodiment, the second linear component corresponds to at least approximately 25% of the full range of operation of the magnetic field transducer.

In an embodiment, the second linear component corresponds to at least approximately 50% of the full range of operation of the magnetic field transducer.

In an embodiment, the second linear component corresponds to at least approximately 80% of the full range of operation of the magnetic field transducer.

In an embodiment, the first linear response component corresponds to a lower absolute current range than the second response region.

In an embodiment, the first linear response component and the second linear response component correspond to non-overlapping current ranges.

In an aspect, the present disclosure may broadly be said to comprise a method comprising the steps of:
  receiving an input signal indicative of an electrical signal output from a current detection device, and
  determining an indication of a current based on the input signal and based on a predetermined response of the output signal from the current detection device, the predetermined response being substantially non-linear.

In an aspect, the present disclosure may broadly be said to comprise a method comprising the steps of:
  receiving one or more input signal(s) indicative of one or more electrical signal(s) output from a current detection device, and
  determining an indication of a current based on the one or more input signal(s) and based on a predetermined response of the one or more signal(s) output from the current detection device, the predetermined response varying in sensitivity across a magnetic flux density operating range of the current detection device.

In an aspect, the present disclosure may broadly be said to comprise a method comprising the steps of:
  receiving one or more input signal(s) indicative of one or more electrical signal(s) output from a current detection device, and
  determining an indication of a current based on the one or more input signal(s) and based on a predetermined response of the one or more signal(s) output from the current detection device, the predetermined response being substantially non-linear across a magnetic flux density operating range of the current detection device.

In an aspect, the present disclosure may broadly be said to comprise a method for manufacturing a current sensor comprising the step of coupling one or more magnetic field transducing devices at least partially within an air gap of a magnetic core, wherein the magnetic core is configured to magnetically saturate at a lower absolute magnetic flux density relative to at least one of the magnetic field transducing devices.

In an aspect, the present disclosure may broadly be said to comprise a method for manufacturing a current sensor comprising the step of coupling a magnetic field transducer at least partially within an air gap of a magnetic core, wherein the magnetic core is configured to magnetically saturate at a lower absolute magnetic flux density relative to the magnetic field transducer.

The features of any one or more of the above embodiments relating to any one of the above method related aspects, can be combined with any one or more other embodiments or aspects described in this section of the patent specification.

Unless stated otherwise, in this specification and claims the phrase "magnetic saturation" and related terms or phrases such as "magnetically saturate", when used in relation to a device, component, element or material is intended to mean a state where an increase in applied external magnetic field cannot substantially increase the magnetisation of the device, component, element or material further, such that a total magnetic flux density of the device or material substantially levels off in response. Unless stated otherwise, when the phrase is used in relation to a single component, element or material, such as a magnetic core of a current sensor, the phrase is intended to refer to the magnetic saturation of that component, element or material in isolation of other devices, components, elements or materials, which may be operatively coupled to that component, such as in isolation of the magnetic field transducers operatively coupled to the magnetic core. On the other hand, and unless stated otherwise, when the phrase is used in relation to a device or system comprising multiple components, devices, or elements, such as a current sensor comprising a magnetic core and a magnetic field transducer, the phrase is intended to refer to the overall magnetic saturation exhibited by the device or system as a result of the combined effect of the magnetic properties relating to those components, devices or elements, such as the combined magnetic saturation effect exhibited by the current sensor as a result of the magnetic properties of both the magnetic core and the magnetic field transducer.

Unless stated otherwise, in this specification, the phrase "saturation flux density" and related terms or phrases, when used in relation to a device, component, element, or material is intended to mean the maximum absolute magnitude of flux density which the device, component, element or material remains responsive, and beyond which the device, component, element or material magnetically saturates.

Unless stated otherwise, in this specification and claims the phrase "operating range" and related terms or phrases, when used in relation to a parameter that is measurable, detectable, or capable of being monitored by a device, such as a current sensor or a magnetic field transducer, is intended to mean the range within which the device can reliably detect, measure, or monitor the relevant parameter while maintaining specified performance criteria. The operating range is defined by the minimum and maximum magnitudes of the relevant parameter, within which the device is designed to function reliably and effectively. Unless stated otherwise, in the context of a device configured to detect, measure, or monitor an indication of magnetic flux density (T), such as a magnetic field transducer or a current sensor, the minimum and maximum flux density magnitudes of the operating range will be limited by the saturation flux density of the device.

Unless stated otherwise, the term "response" as used in this specification and claims with reference to a device configured to receive or observe an input and generate an output based on the input, such as a current sensor, defines how the device reacts or changes its output or an output parameter (such as Voltage (V)) in response to variations in the input or an input parameter (such as current (A) or magnetic flux density (T)), and refers to the relationship between the input or input parameter and the output or output parameter under specified or nominal operating conditions. The response may include characteristics of the relationship between the input or input parameter and the output or output parameter such as linearity, sensitivity, accuracy, and dynamic range.

Unless stated otherwise, the phrases "response zone" and "response region" as used in this specification and claims refer to the response of a device within a sub-range of the operating range.

Unless stated otherwise, the term "sensitivity" as used in this specification and claims, with respect to the response of a device, is intended to mean the degree to which the device reacts or provides an output signal in response to changes in the input parameter it is designed to observe or monitor. A response having higher sensitivity indicates that the output signal changes to a greater degree for a unit change in the input parameter, whereas a response having lower sensitivity indicates that the output signal changes to a lesser degree for the same unit change in the input parameter.

Unless stated otherwise, the term "resolution" as used in this specification and claims, with respect to the response of a device, is intended to refer to the smallest change in an input parameter that the device can detect accurately. A higher resolution indicates the device's ability to make finer distinctions between different levels of the input parameter.

Unless stated otherwise, the term "accuracy" as used in this specification and claims, with respect to the response of a device, is a measure of how closely the device's output or measurement corresponds to the true or actual value of the input parameter or quantity being observed or measured by the device.

Unless stated otherwise, the term "linearity" as used in this specification and claims, with respect to the response of a device, refers to the extent to which the output of a device is proportional to the input parameter it is designed to observe or monitor. A device is considered to have a substantially linear response or a linear response zone when the response or response zone follows a substantially consistent relationship with the input parameter, typically characterised by a substantially straight-line or near straight-line response between the output and the input parameter. Substantial deviations from linearity are considered a non-linearity and a device is considered to have a non-linear response when there is at least one response zone within the operating range that exhibits non-linearity.

Unless stated otherwise, the term "substantially" (and variations thereon) when modifying a relationship may include not only the recited "substantial" relationship, but also the full extent of the recited relationship. A substantial amount of a recited relationship may include at least 75%, at least 85%, or at least 95% of the recited relationship. For example, a response that is at least substantially non-linear is at least 75%, at least 85%, or at least 95% non-linear and includes responses that are completely non-linear. As another example, a current that is substantially entirely concentrated by a magnetic core is at least 75%, at least 85%, or at least 95% concentrated by the magnetic core. Additionally or alternatively, the term "substantially" (and variations thereon) may be replaced with "significantly," "nearly," "greatly," "almost entirely," "mainly," "essentially," "basically," "to a large extent," "to a marked extent," "in essence," "markedly," and so forth.

Unless stated otherwise, the term "approximately" (and variations thereon) when modifying a relationship may include not only the recited "approximate" relationship, but also the full extent of the recited relationship. An approximate amount of a recited relationship may include within 15%, within 10%, or within 5% of the recited relationship. For example, "approximately 50%" includes 35%-65%, 40%-60%, or 45%-55%. Additionally or alternatively, the term "approximately" (and variations thereon) may be replaced with "roughly," "about," "just about," "more or less," "in the region of," "in close proximity to," and so forth.

When interpreting each statement in this specification and claims that includes the term "comprising", features other than that or those prefaced by the term may also be present. Related terms such as "comprise" and "comprises" are to be interpreted in the same manner.

It is intended that reference to a range of numbers disclosed herein (for example, 1 to 10) also incorporates reference to all rational numbers within that range (for example, 1, 1.1, 2, 3, 3.9, 4, 5, 6, 6.5, 7, 8, 9 and 10) and also any range of rational numbers within that range (for example, 2 to 8, 1.5 to 5.5 and 3.1 to 4.7) and, therefore, all sub-ranges of all ranges expressly disclosed herein are hereby expressly disclosed. These are only examples of what is specifically intended and all possible combinations of numerical values between the lowest value and the highest value enumerated are to be considered to be expressly stated in this application in a similar manner.

As used herein the term "and/or" means "and" or "or", or both.

As used herein "(s)" following a noun means the plural and/or singular forms of the noun.

The present disclosure comprise the foregoing and also envisages constructions of which the following gives examples only.

Embodiments of a current detection device (herein referred to as a "current sensor") will now be described with reference to the drawings, as well as circuits, devices, or systems incorporating these current sensors. The current sensor embodiments disclosed herein each comprise a pre-configured operating response with varied sensitivity across the full range of operation of the sensor. This enables the extension of the current sensor's full range of operation while maintaining other response characteristics, such as a target degree of sensitivity for a predefined response zone and/or a target minimum accuracy, sensitivity and/or resolution of the response across the full range of operation. In the embodiments disclosed herein, a pre-configured, substantially non-linear response is preferably exploited to attain the varied sensitivity of the sensor. The substantially non-linear response may comprise multiple response zones, wherein at least one of the zones is substantially non-linear. One or more other response zone(s) are preconfigured to comprise a substantially linear response. In this specification and claims, reference to a preconfigured response with respect to a current sensor is intended to mean a deliberate configuration of the sensor's response characteristics. This configuration may involve intentionally introducing non-linearities or customised response profiles to optimise the sensor's performance for a particular application or signal processing task. While both the inherent response and pre-configured response arise from a sensor's physical properties and design, a preconfigured response is intended to mean a response established intentionally during the sensor's design or configuration phase and tailored to meet target performance criteria. The preconfigured non-linear response should be distinguished from non-linearity introduced as a result of sensor imperfections or other unintentional inherent characteristics, which may subsequently be addressed by signal processing techniques, such as known linearisation techniques. The output of the current sensor may still be processed via signal processing techniques to "linearise" the preconfigured non-linear response for interpretation of the output signal.

Exemplary current sensor embodiments having preconfigured response profiles as defined above, will be described herein, each comprising a magnetic core and at least one magnetic field transducer positioned at least partially within an air gap of the magnetic core. The magnetic field transducer comprises a saturation flux density that is substantially greater than a saturation flux density of the magnetic core. In this manner, the current sensor's range of operation with respect to a measured or detected parameter (either current (A) or magnetic flux density (T)) may be extended beyond the minimum and maximum saturation flux density magnitudes of the magnetic core, while maintaining a minimum degree of accuracy, sensitivity and/or resolution in the response. This is unlike traditional current sensor designs which limit their range of operation based on the saturation flux density of the magnetic core, and beyond this point the saturation of the magnetic core significantly reduces the accuracy, sensitivity and resolution of the sensor's response.

The magnetic saturation of the magnetic core within the sensor's range of operation results in a non-linearity in the response corresponding to this saturation point. On one or both sides of this non-linear response zone, the sensor may be preconfigured to have a substantially linear response. Each substantially linear response may comprise a distinct sensitivity. In a preferred implementation, the current sensor structure may be configured to comprise two substantially linear response zones on either side of each non-linear response zone. The substantially non-linear response of the current sensor is the response associated with a signal output from the current sensor indicative of a sensed magnetic flux density of a magnetic field in the presence of the current sensor.

Unless stated otherwise, the current sensor embodiments described herein are configured to operate and detect a current in both alternating current and direct current systems.

Figure 1B:
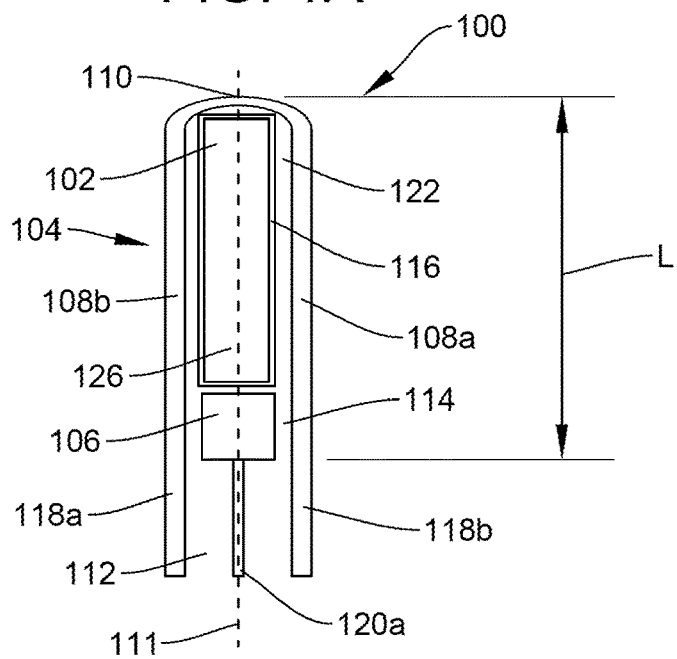
FIG. 1B is a cross-section view of the current detection device of FIG. 1A.

Referring to FIG. 1A and FIG. 1B, a first embodiment current detection device 100 (herein referred to as "current sensor 100") of the present disclosure is shown. In FIG. 1A the current sensor 100 is shown in situ, coupled to, or comprising a current-carrying conductor 102. The current sensor 100 comprises a magnetically permeable core 104 (herein magnetic core 104) configured to encapsulate a part or section of the conductor 102, along a length of the conductor 102. The magnetic field transducer 106 locates at least partially within an air gap interface 114 of the magnetic core 104. The air gap interface 114 and magnetic field transducer 106 locate proximal to and directly adjacent the conductor 102, in situ. During operation, as electrical current flows through the conductor 102, a magnetic field is emitted from the conductor 102, and the magnetic core 104 concentrates at least part of this magnetic field towards the air gap interface 114. The magnetic field transducer 106 converts the flux density of the present magnetic field into a measurable or quantifiable output electrical signal indicative of the magnetic flux density. The output signal may be a voltage or current signal, indicative of the input flux density, for example. The magnetic core 104 may be referred to as a magnetic field concentrator in this specification and claims. The magnetic core 104 comprises a substantially lower saturation flux density ($B_s$) relative to the saturation flux density ($B_s$) of the magnetic field transducer 106. In this manner, when relatively low currents flow through conductor 102, the magnetic core 104 remains undersaturated and a majority or all of the magnetic field emitted by the current and conductor 102 is concentrated by the magnetic core 104 onto the air gap interface 114. Accordingly, the magnetic flux density measured or detected at the magnetic field transducer 106 substantially entirely corresponds to the magnetic flux density of magnetic field emitted by the magnetic core 104 at/within the air gap interface 114. At relatively higher currents, the intensity of the magnetic field emitted by the current flowing in the conductor 102 increases such that the absolute magnitude of the corresponding flux density generated at the magnetic core 104 reaches the saturation flux density of the magnetic core 104. Beyond this point, the magnetic core 104 can only concentrate part of the magnetic field emitted by the conductor 102 onto the magnetic field transducer 106. Any excess magnetic flux in the presence of the magnetic field transducer 106, that could not be concentrated by the magnetic core 104, may still be transduced by the magnetic field transducer 106, since the saturation flux density of the magnetic field transducer 106 exceeds that of the magnetic core 104. Accordingly, the magnetic flux density transduced by the magnetic field transducer 106 may partially correspond to the magnetic field concentrated and emitted by the magnetic core 104, and partially correspond to any excess magnetic field emitted by the conductor 102 that could not be concentrated by the magnetic core 104. In this state of operation, the output of the magnetic field transducer 106 continues to change with greater accuracy than if the sensor had been fully saturated.

Figure 2A:
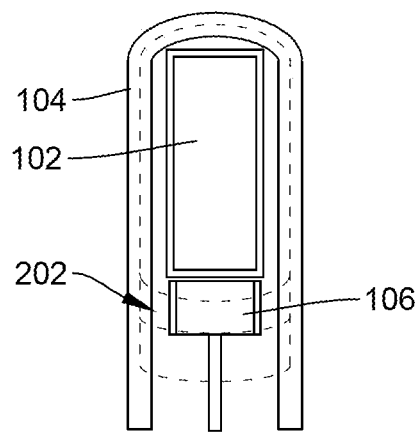
FIG. 2A is a cross-section view of the current detection device of FIG. 1A, showing the current detection device in a first state of operation.
Figure 2B:
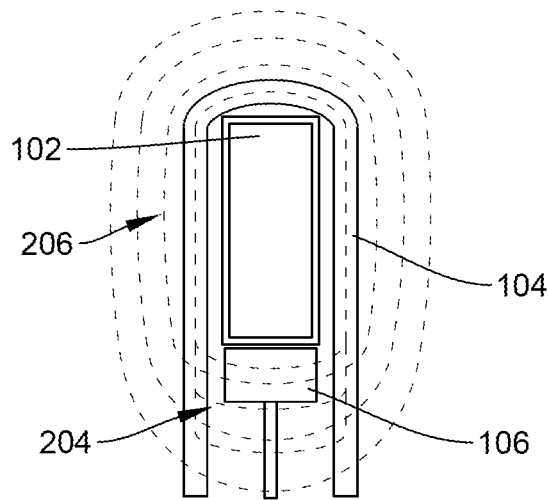
FIG. 2B is a cross-section view of the current detection device of FIG. 1A, showing the current detection device in a second state of operation.

The abovementioned states of operation of current sensor 100 are exemplified in FIG. 2A and FIG. 2B. Referring to FIG. 2A, when the absolute current magnitude flowing through the conductor 102 is relatively low, e.g., 0-50 amperes, a magnetic field 202 generated by the current is substantially entirely concentrated by the magnetic core 104, as the core 104 remains undersaturated (i.e., is not magnetically saturated). In other words, the absolute magnitude of the magnetic flux density generated in the magnetic core 104 is substantially lower than the saturation flux density of the magnetic core 104. The magnetic field transducer 106 transduces the magnetic field concentrated by the core 104, and generates an output signal indicative of the associated magnetic flux density. The output signal is also indicative of the corresponding electrical current through the conductor 102. In this state of operation, the accuracy of the output signal and response of the sensor 100 is relatively high, as the majority of the magnetic field generated by the conductor is concentrated towards and onto the magnetic field transducer 106.

Referring to FIG. 2B, at relatively high currents, e.g., between approximately 50 to 500 amperes, or 50 to 1000 amperes, the magnetic field(s) 204 and 206 generated by the current flowing in the conductor is(are) only partially concentrated by the magnetic core 104 (magnetic field component 204), as the magnetic core 104 reaches magnetic saturation (e.g., at around 50 amperes). This magnetic field component 204 is concentrated towards the magnetic field transducer 106, which results in an output signal being generated that corresponds to the magnetic flux density of this field component 204. Additionally, the magnetic field transducer 106 may also be in the presence of another magnetic field component 206, which has not been absorbed and concentrated by the magnetic core 104. As the saturation flux density of the magnetic field transducer 106 exceeds that of the magnetic core 104, the magnetic field transducer 106 also responds to the presence of this field 206, generating an output corresponding to the combination of the concentrated magnetic field 204 and the non-concentrated magnetic field 206. The output electrical signal, in this case, remains indicative of current flowing through the conductor 102, but may be of lower accuracy and/or sensitivity as part of the field 206 is non-concentrated and therefore only partially detectable by the magnetic field transducer 106.

In another state of operation, as the current flowing through the conductor 102 starts to generate a magnetic field strength in the presence of the magnetic field transducer 106 that magnetically saturates the magnetic field transducer 106, e.g., more than approximately 500 Amps, or more than approximately 1000 Amps, the accuracy and/or sensitivity of the transducer output signal begins to significantly diminish. After this point any additional current in the conductor 102 will no longer have any effect on the output of the magnetic field transducer 106, but drive it more into saturation. The accuracy and/or sensitivity of the response reduces gradually with increasing current flow in the saturation region, until the magnetic field transducer 106 fully saturates.

Figure 3:
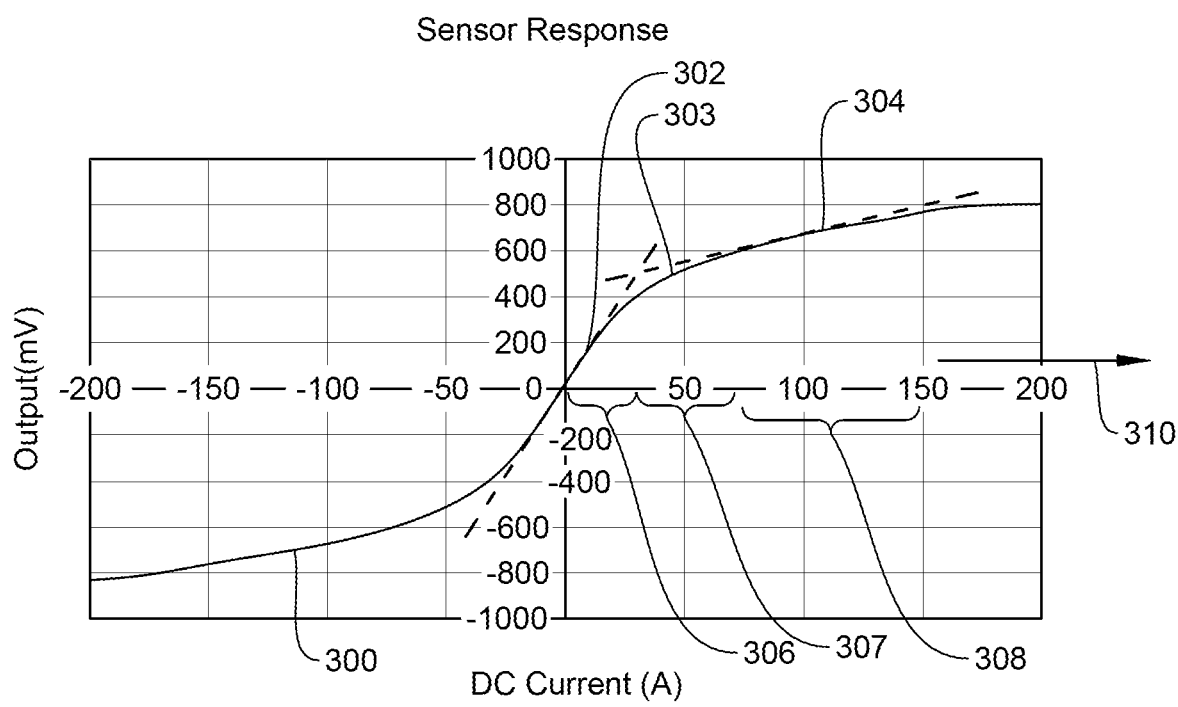
FIG. 3 is a graph illustrating an exemplary response of the current detection device of FIG. 1A.

In this embodiment, the magnetic field transducer 106 is configured to output an electrical signal indicative of the current flowing through the conductor 102. Referring to FIG. 3, an exemplary preconfigured response 300 of the current sensor 100, indicative of the signal output from the magnetic field transducer 106, is represented graphically. An inner response region or zone 306 represents the relatively lower current region of operation and an outer response region or zone 308 represents the relatively higher current region of operation. In this specification, unless specifically stated otherwise, reference to relatively lower or higher magnitudes, in relation to currents, magnetic field intensities, magnetic fluxes, and magnetic flux densities, is intended to mean lower or higher absolute magnitudes, unless stated otherwise. Inner current region 306 corresponds to the operation of the current sensor 100 as exemplified in FIG. 2A, where the majority or the entire magnetic field 202 generated by the current flowing in the conductor 102 is concentrated through the magnetic core 104, while the magnetic core 104 remains magnetically undersaturated. The response 300 is preferably pre-configured such that a substantially linear response 302 can be exhibited during this state of operation, where the output electrical signal (in this case a voltage) is substantially directly proportional to the current flowing through the conductor 102 and/or to the magnetic flux density detectable by the magnetic field transducer 106. During this state of operation, the sensitivity of the current sensor 100 is relatively high and accordingly, the gradient of the response 302 is also relatively high.

Outer current region 308 corresponds to the operation of the current sensor 100 as exemplified in FIG. 2B, where part 204 of the magnetic field 204, 206 generated by the conductor 102 is concentrated and drives the magnetic field transducer 106, and a non-concentrated part 206 also drives the magnetic field transducer 106. The concentrated magnetic field 204 saturates the magnetic core 104 at this higher current region 308. But the magnetic field transducer 106 remains undersaturated and accordingly the output response 304 continues to vary with varying current through the conductor 102. Since the component 206 of the magnetic field generated by the current carrying conductor that is driving the magnetic field transducer 106 is non-concentrated, the accuracy of the response 304 may be lowered in this higher current region 308 (meaning some of the magnetic field emitted by the conductor 102 may not be received by the magnetic field transducer 106). The preconfigured higher current response 304 may also be substantially linear in this region 308 with the output of the magnetic field transducer 106 remaining substantially proportional to the current flowing through the conductor 102. The degree of linearity may be the same or similar to that of response 302, or it may be slightly lower in some embodiments. The sensitivity of the response 304 in region 308 may be the same or similar to the sensitivity of the response 302 in region 306 in some implementations. In other implementations it may be relatively lower than the sensitivity of the response 302 in region 306. In further embodiments it may be relatively greater. In some embodiments, the response 304 in response region 308 may be substantially non-linear but predetermined and predictable. The sensitivity and/or resolution of the output signal may be lowered, relative to the lower current response region 306 and response 302. However, the sensitivity and accuracy of the response 304 in region 308 remains greater than the response of the sensor beyond the point of magnetic saturation of the magnetic field transducer 106.

Beyond this outer response region 308, the magnetic field generated by the current flowing in the conductor 102 saturates the magnetic field transducer 106 and the current sensor 100 will no longer output a signal that is indicative of the current flowing through the conductor 102. This saturated region 310 is considered outside the magnetic field transducer's 106 and the current sensor's 100 range of operation. This is exemplified with a substantially flattened region 310 having a zero or near zero gradient in FIG. 3.

The intermediate or transition region 307 between inner current region 306 and outer current region 308 shows the intermediate 'knee-point' in the response 300, where the magnetic core 104 transitions from being magnetically undersaturated (end of lower current region 306), to being magnetically fully saturated (beginning of higher current region 308). In this region 307, the preconfigured response 303 is substantially non-linear, and may be substantially parabolic. Similarly, an intermediate or transition region between outer current region 308 and saturated region 310 may comprise a substantially non-linear response, e.g., parabolic, indicative of the transition of the magnetic field transducer 106 from being magnetically undersaturated (end of region 308 and start of region 310) to being saturated (region 310 and beyond). The response in intermediate region 307, although non-linear, can be predetermined and accounted for in the process of analysis and/or measurement of the output signal of the magnetic field transducer 106. Accordingly, the current sensor 100 remains operative across the full range of operation, defined by the response range of regions 306, 307 and 308 (and their counterpart negative response regions which have not been referenced in the figure). The sensitivity, linearity and/or accuracies across the various regions may be varied and predetermined, but in all regions or zones 306, 307, 308 the sensitivity and/or accuracy of the current sensor response remains greater than the sensitivity and/or accuracy of the response of the sensor 100 when the magnetic field transducer 106 is fully magnetically saturated.

By tailoring the saturation flux density of the magnetic core 104 to be substantially lower than the saturation flux density of the magnetic field transducer 106, the overall response of the current sensor 100 across the sensor's full range of operation (i.e., below saturation) becomes substantially non-linear. In this specification, reference to a non-linear response with respect to the current sensor 100 is intended to mean an overall non-linear response within the current sensor's range of operation that excludes the region of saturation of the sensor (or immediately preceding saturation). A non-linear response may comprise multiple distinct linear response components.

For instance, in this exemplary embodiment, and with reference to the positive polarity of the response only, the response 300 initially exhibits a substantially linear or near linear response 302, having a substantially steep gradient indicating a relatively high sensitivity. Changes in the conductor current lead to proportional and relatively larger increases in the sensor's output in this region 306. As the conductor current continues to rise, saturation of the magnetic core 104 begins to impose a non-linear curve that gradually inclines and reduces in slope. This is response 303 in region 307. As the magnetic core 104 fully saturates, the curvature of the response 307 settles into a substantially linear or near linear response 304, with a relatively shallower gradient compared to response 302. Finally, as the conductor current 100 continues to rise beyond the saturation knee point of the magnet field transducer 106, the response 308 evolves again into a gentler, more gradual incline which then transitions into an even shallower slope forming a plateau corresponding to saturation of the sensor 100. The sensor's response becomes increasingly resistant to further input changes, and any additional increase in the conduct current results in minimal changes in the output in and beyond this region 310. The negative polarity side of the response 300 preferably mirrors the same shape and characteristics as the positive polarity side but exhibits an inverted polarity. In other words, as the input decreases in magnitude or becomes negative, the sensor's output follows an equivalent curve, but with the opposite direction or sign of the output value. This symmetry ensures that the sensor's response maintains a consistent profile regardless of whether the input is positive or negative.

In the embodiment shown, the overall response of the current sensor 100 comprises two distinct linear response components; a first linear response 302 component corresponding to relatively lower conductor current region 306 and a second linear response 304 component corresponding to a relatively higher conductor current region 308. In some embodiments, the first and/or second responses may also be non-linear, although linearity is preferred in one or both of these (e.g., the first and/or the second) response regions to enable lower processing complexity of the output signal. The first linear response 302 preferably comprises a greater gradient than the second linear response 304, indicating a relatively higher sensitivity to variations in the conductor current (and/or variations in the magnetic flux density at the magnetic field transducer 106). The second linear response 304 preferably also comprises a gradient greater than zero, indicating a substantially proportional relationship between the current flowing through conductor 102 and the output of the current sensor 100, albeit with potentially lower accuracy and/or sensitivity than the response 302. The second linear response 304 preferably also comprises a gradient (i.e., sensitivity) that is greater than the current sensor or magnetic field transducer response within a region of saturation of the current sensor or magnetic field transducer.

A third transition response region 307 (distinct from and between 306 and 308) may comprise a linear response, or more likely a non-linear response, such as a parabolic response. This response region is indicative of the transition of the magnetic core 104 from being magnetically under-saturated to becoming magnetically saturated. The second linear response region 304 is distinct from and excludes this transition region. It is also distinct from and excludes a region of operation where the current sensor 100 and/or the magnetic field transducer 106 are saturated. In other words, it is encompassed within the range of operation of the current sensor.

The second linear response region 308 may comprise greater than approximately 25% of the current sensor's full range of operation. More preferably the second response region 308 comprises a majority of the current sensor's full range of operation (e.g., from 60A to 1000A for a 0-1000A range of operation that excludes a substantially fully saturated region of operation). In some embodiments, the second response region 308 may comprise more than approximately 50%, or more than approximately 80%, or more than approximately 90% of the current sensor's full range of operation. Conversely, the first response region 306 may comprise less than approximately 50%, or less than approximately 40%, or less than approximately 20%, or less than 10% of the current sensor's range of operation. The first response region 306 comprises a lower absolute current range than the second response region 308. The first response may comprise more than approximately 1%, or more than approximately 2.5%, or more than approximately 5% of the current sensor's full range of operation. It will be appreciated that these ranges are only exemplary and may be tailored to suit a particular application depending on the sensitivity levels required at the various operating ranges within the current sensor's full range of operation (excluding the substantially fully saturated region).

The response of the current sensor 100 in region 310 comprises a further substantially linear response region, with a gradient that is substantially lower than that of response 306 and that is indicative of saturation of the current sensor 100 (e.g., zero or near zero gradient). This region is considered outside of the current sensor's full range of operation.

In the embodiments described herein, although reference has been made to one inner response region 306, one central response region 307, and one outer response region 308, it will be appreciated that this is in relation to a single (positive) polarity of the response. In an embodiment where the current sensor is configured to detect alternating current, the current sensor is preconfigured to comprise a response 300 having opposing (negative) polarity counterpart response regions. Accordingly, the current sensor response comprises a pair of inner response regions 306 of opposing polarities and each having a corresponding response (e.g., 302) as described herein, a pair of outer response regions 308 of opposing polarities and each having a response (e.g., 304) as described herein, and a pair of intermediate response regions 307 of opposing polarities and each having a response as described herein. A positive polarity response is characterised by its behaviour in response to positive current values flowing through the conductor, while a negative polarity counterpart of a response represents the sensor's response to negative current values. In this specification, unless stated otherwise, reference to a response and to a response region or zone is intended to cover both positive and negative polarity counterparts of that response or response region in the case where the current sensor comprises an operating range encompassing both negative and positive currents (i.e., alternating current).

In some embodiments, the current sensor 100 may be preconfigured to comprise one or more additional response regions to regions 306, 307, 308 and their counterparts, the other response regions also having distinct responses relative to the responses of regions 306, 307, 308 or at least relative to the response of adjacent response regions.

The saturation flux density of the magnetic core 104 can be tailored via the material properties of the core, the size and cross-sectional area of magnetic core 104, the size of the air gap interface 114, and/or by forming the core from one or more layers of material(s). Accordingly, reference to the saturation flux density of the magnetic core 104 in this specification is intended to mean the overall saturation flux density resulting from the material and structure of the core and including any air gap interruptions within the core. In an embodiment, the magnetic core 104 comprises a saturation flux density ($B_s$) between approximately 0.1 milli Teslas (mT) and approximately 50 mT, more preferably between approximately 1 mT and approximately 10 mT and most preferably between approximately 1 mT and approximately 5 mT.

The saturation flux density of the magnetic field transducer 106 can be tailored based on the material and design properties of the transducing element(s) or device(s) incorporated in the transducer, the particular selection of a supplied device. The magnetic field transducer 106 may comprise a saturation flux density ($B_s$) that is greater than the saturation flux density of the magnetic core and between approximately 1 mT and 500 mT, more preferably between approximately 5 mT and 250 mT and most preferably between approximately 10 mT and 150 mT. The magnetic core 104 may comprise a saturation flux density that is less than approximately 50% of the saturation flux density of the magnetic field transducer 106, more preferably less than approximately 25%, and most less than 10%. The saturation flux density of the magnetic core 104 may be greater than approximately 1% of the saturation flux density of the magnetic field transducer 106, or more than approximately 5% of the saturation flux density of the magnetic field transducer 106. Tailoring or tuning of the relative saturation flux densities of the transducer 106 and magnetic core 14, adjusts the knee point of the curve of response 300 at region 307, as well as the responses in regions 306 and 308.

The magnetic core 104 may comprise one or more magnetic material(s), such as, but not limited to: ferrite, steel, an iron compound, or a permalloy. The magnetic core 104 preferably comprises one or more soft-magnetic material(s), having a relatively high permeability such as, but not limited to: iron, low-carbon steel, silicon steel, iron-aluminium-silicon alloys, nickel-iron alloys, iron-cobalt alloys, ferrites, and amorphous alloys. The magnetic core may be formed from a soft ferromagnetic alloy having a high relative permeability, such as a mu-metal material. The material of the magnetic core 104 may be selected based on factors such as maximum measured current and the desired amount of magnetic shielding provided. Other factors include stability of the relative permeability over temperature and hysteresis (magnetic remanence). For example, a low hysteresis ensures greater accuracy for small currents through the conductor 102. The material and size of the magnetic core 104 may be also selected in accordance with the target full range of detection of the current through the conductor 102, wherein a magnetic core material with a higher saturation flux density ($B_s$) allows the use of a smaller core for a given current flowing through the conductor 102.

The magnetic core 104 preferably comprises at least 50% of mu-metal material(s), more preferably at least 70%, and most preferably at least 80%. The magnetic core 104 may comprise a nanocrystalline material, such as a nanocrystalline mu-metal material. The material composition of the magnetic core 104 preferably comprises at least 50% of nanocrystalline material(s), more preferably at least 75% and most preferably at least 90%. In an embodiment, the material composition of the magnetic core 104 may comprise approximately 100% of a nanocrystalline material or materials.

The magnetic core 104 may be formed from a single layer of material(s), or it may be formed from a plurality of layers. If formed from a plurality of layers, the layers are preferably laminated. The magnetic core 104 may be formed from a plurality of layers of the same material(s) to thereby increase the relative magnetic permeability of the magnetic core 104, relative to a similar magnetic core 104 comprising the same material(s) but formed as a single layer and all else being equal. The multiple layers may also reduce eddy currents. The multiple layers may comprise at least the same type of magnetic material(s). For instance, each layer may comprise a mu-metal material, and/or a nanocrystalline material. In some embodiments, one or more layers may comprise different material(s). The magnetic core may comprise 8 layers of magnetic material(s) or less. In another exemplary implementation the magnetic core may comprise 6 layers of magnetic material(s) or less. In yet another exemplary implementation, the magnetic core may comprise 4 layers of magnetic material(s) or less.

In an embodiment, the magnetic core 104 may comprise a relative magnetic permeability (li r) of between approximately 5,000 and 20,000, more preferably between 10,000 and 100,000 and most preferably between 50,000 and 1M.

The magnetic core 104 comprises a substantially U-shaped cross-sectional profile to interface with a conductor 102. Preferably, at least the inner periphery of the magnetic core 104 comprises a substantially U-shaped profile. Preferably the profile of the inner periphery, and more preferably of the magnetic core in general is U-shaped to interface with a substantially planar conductor. The magnetic core 104 comprises a pair of opposing walls 108a and 108b separated by an air gap, forming a channel 122 therebetween. The channel 122 is configured to receive and accommodate the conductor 102. In an exemplary implementation, the magnetic core 104 is configured to receive and closely accommodate a substantially planar conductor 102, such as a busbar. Accordingly, the first opposing wall 108a and second opposing wall 108b are substantially planar to correspond to the planar surface of each of the major faces of the conductor 102. The opposing walls 108a and 108b preferably closely accommodate the conductor 102 therebetween by having an interior surface corresponding to the outer surface of the corresponding major face of the conductor 102.

The distance between the opposing walls 108a and 108b is preferably greater than the thickness of the planar conductor 102 (i.e., the distance between the opposing major faces of the conductor 102), so that the magnetic core 104 maintains physical separation with the conductor 102, in situ, but the separation is preferably minimal to increase the magnetic coupling between the conductor 102 and magnetic core 104, in situ.

In an embodiment, the conductor 102 is substantially insulated with an insulating layer 116 applied to an outer surface of the conductor 102 directly adjacent to the magnetic core 104. This electrically isolates the magnetic core 104 from the conductor 102. Any suitable electrically insulating material, such as a plastics material (e.g., an electrical tape) may be used, as is known in the art. The insulating material preferably couples directly between each opposing wall 108a, 108b and the corresponding major face of the conductor 102. In an exemplary implementation, a small air gap may exist between the conductor 102 and one or both opposing walls 108a, 108b of magnetic core 104. In another implementation the insulating layer 116 may contact and sit substantially flush against the inner periphery of the magnetic core 104.

The opposing walls 108a and 108b maintain a substantially uniform distance or gap therebetween at least a region of the walls 108a, 108b configured to locate adjacent the major faces of the conductor 102. Accordingly, the channel 122 preferably comprises a uniform thickness and/or width in a region of the channel 122 configured to receive the conductor 102.

The opposing walls 108a and 108b preferably each comprise a length, L, (in a direction parallel to the longitudinal axis 126) that is greater than a width, W, of the corresponding major face of the conductor 102, to thereby substantially encapsulate the full width of the conductor 102, in situ, and provide a required creepage distance.

The first opposing wall 108a and second opposing wall 108b are connected at a first mutual closed end 110 of the magnetic core 104. The magnetic core 104 further comprises an open end 112 opposing the closed end 110. The magnetic core 104 further comprises an air gap interface 114 for receiving and accommodating the magnetic field transducer 106 therebetween. The air gap interface 114 is preferably configured to centrally accommodate the magnetic field transducer 106 between the pair of opposing walls 108a and 108b and is aligned with the channel 122 along longitudinal axis 126. The air gap interface 114 is positioned distal from the closed end 110 and adjacent the open end 112 of the magnetic core 104. In situ, the magnetic field transducer 106 is configured to locate directly adjacent and is preferably substantially aligned with a longitudinally extending, narrow side 128 of the conductor 102 that extends between the major faces of the conductor 102. In other words, in situ, the magnetic field transducer 106 aligns with the channel 122 and conductor 102 along a longitudinal axis 126 that is substantially perpendicular to the main longitudinal axis 124 of the conductor 102. The magnetic core extends to substantially entirely accommodate the magnetic field transducer 106, or at least the active transducing elements of the transducer 106, within the air gap interface. Preferably, the first opposing wall 108a and second opposing wall 108b extend to form an air gap interface 114 that substantially entirely accommodates the magnetic field transducer 106 therewithin. This configuration may provide a more consistent geometry that maximises the magnetic flux exhibited by the magnetic field transducer during operation, thereby increasing device sensitivity and potentially also reducing susceptibility to stray magnetic fields. The walls 108a, 108b may extend slightly beyond the magnetic field transducer 106. In some embodiments, however, the magnetic field transducer may partially locate within the air gap interface 114. Preferably, one or more active magnetic field transducing element(s) or surface(s) of the magnetic field transducer 106 (not shown) is(are) positioned and oriented to maximise the accuracy of a response in the presence of a magnetic field extending between the opposing walls 108a and 108b at the air gap interface 114. For example, one or more active surface(s) may be oriented substantially orthogonal to a magnetic field direction extending between the opposing walls at the air gap interface 114. Preferably the width of the air gap interface 114 is minimised such that the opposing walls 108a, 108b locate directly adjacent the transducer 106 on either side of the transducer 106, and in some implementations may abut the transducer 106 at either side. The magnetic core 104 preferably comprises a curved body of a substantially continuous length with a single air gap interface 114 along the continuous length.

The opposing walls 108a and 108b may maintain a substantially uniform distance or gap therebetween, along a majority, or more preferably along the full length, L, of the walls 108a and 108b (along a longitudinal axis 126 of the wall and/or magnetic core 104). In this case, the channel 122, configured to receive the conductor 102, and the air gap interface 114 configured to receive the magnetic field transducer 106, comprise the same or similar gap sizes (along a general plane of the U-shaped core (and conductor, in situ)). Preferably the width of the channel is slightly greater than the thickness of the conductor 102 so the magnetic core can closely encapsulate the conductor 102.

Figure 6:
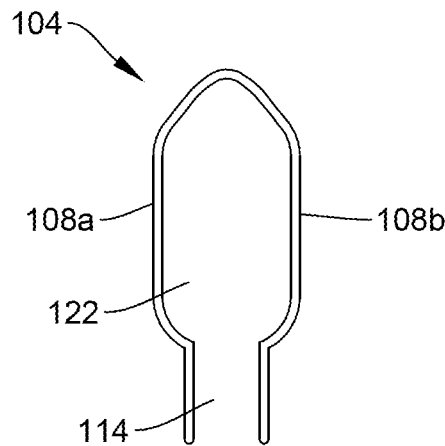
FIG. 6 is a schematic of a variation of the magnetic core applicable to any of the current detection device embodiments of the present disclosure.

FIG. 6 shows a modification on the structure of the magnetic core 104, wherein the opposing walls 108a and 108b comprise a reduced distance or gap at the air gap interface region 114, relative to the channel 122 to more closely accommodate the magnetic field transducer 106 therewithin. The air gap interface 114 preferably comprises a substantially uniform gap along the corresponding length of walls 108a and 108b. In this manner, the magnetic core 102 may comprise an open end of reduced width, along an axis that is substantially perpendicular to the general plane of the U-shaped core (and conductor, in situ. Where multiple magnetic field transducing devices may be implemented for the magnetic field transducer 106, the air gap interface 114 is preferably substantially uniform in the width dimension that is substantially perpendicular to the general imaginary plane 111 of the U-shaped core, along the longitudinal axis of the core. In this manner, both transducing devices exhibit a same or similar magnetic flux density concentrated by the magnetic core 104.

In an embodiment, the magnetic core 104 comprises a retention mechanism to hold the magnetic core in position relative to the conductor 102 in situ. For instance, the magnetic core 104 may comprise a resilient open end 112 configured to resiliently couple and clamp over the conductor by spring retention. In another example the core may comprise an open end configured to couple over the conductor and an additional non-magnetic part may couple over and encapsulate both parts to provide a retention mechanism by friction or mechanical interlock. In another example the non-magnetic retention mechanism may be retained by affixing to a substrate or base positioned below the conductor 102. The magnetic field transducer 106, magnetic core 104 and conductor 102 may be coupled to a common base or substrate to position them appropriately relative to one another.

In an exemplary implementation, the magnetic field transducer 106 may comprise a Hall effect sensor. The Hall effect sensor may comprise connection lead or pins 120a-120c adapted for mounting to a printed circuit board or other substrate (not shown). The connections leads or pins 120a-120c may include a power, or Vcc, connection, a ground connection, and an output connection adapted to carry an output electrical signal indicative of the current through the conductor 102. Alternatively, the hall effect sensor may contain more than three connections with the additional connection providing additional output signals indicative of the current through the conductor 102, or additional functional features.

The Hall effect sensor die may include at least one active Hall effect element and Hall circuitry for processing the output signal of the Hall effect element and providing the output signal indicative of a magnetic flux density. The Hall circuitry may include one or more amplifier(s), filter(s), and output driver(s), for instance. It will be appreciated by those with ordinary skill in the art that other circuitry may be provided in or with the Hall effect sensor to condition electrical signals generated by the active Hall effect element(s) before outputting the signals for transmission or further processing.

As mentioned, each active Hall element is preferably oriented such that a general plane of a major active surface of the Hall element is substantially parallel to the plane of one or both opposing walls 108a and 108b at the air gap interface 114. Accordingly, the magnetic field emitted by the magnetic core 104 within the air gap interface 114 is substantially normal to the general plane of the major active surface of the Hall element to increase device sensitivity and reduce susceptibility to stray fields, during operation. Preferably, substantially the entirety of the active surface of the Hall element is located within the opposing walls 108a and 108b to increase device sensitivity and reduce susceptibility to stray fields, during operation. The gap between the opposing walls 108 and 108b and the Hall element is preferably minimised to increase magnetic coupling between the core 102 and magnetic field transducer.

In some embodiments, other magnetic field transducing mechanisms may alternatively be used in magnetic field transducer 106, such as magnetic field transducers having an isotropic magnetoresistance (AMR) element or a giant magnetoresistance (GMR) element with non-linear operating characteristics as described herein. The magnetic field transducer is preferably a solid-state magnetic field transducer. Alternative elements may require alternative orientations of the die to maximise the accuracy of the response in the presence of a magnetic field extending between the corresponding air gap interface 114.

The magnetic field transducer 106 may comprise an integrated device having one or multiple magnetic field transducing elements or devices, each configured to output a distinct electrical signal representative of a magnetic flux density exhibited by the magnetic field transducing device or element. Each magnetic field transducing device or element may comprise a response having a distinct sensitivity. The response of each device or element is preferably also substantially linear. Each device or element may also comprise a distinct saturation flux density.

In an exemplary embodiment, the magnetic field transducer 106 may comprise a first magnetic field transducing device or element configured to output a first electrical signal in the presence of a magnetic field, and based a first preconfigured response. The magnetic field transducer 106 may further comprise a second magnetic field transducing device or element configured to output a second electrical signal in the presence of a magnetic field based on a second preconfigured response. The first and second preconfigured responses may be distinct and varied in terms of linearity, sensitivity and/or saturation flux density or operating range, for instance. In an embodiment, the first and second preconfigured responses are distinct and vary with respect to sensitivity of the responses. In an embodiment, the first and second preconfigured responses are distinct and vary with respect to saturation flux density/operating ranges of the response. Accordingly, the first preconfigured response of the first magnetic field transducing device or element of transducer 106 may substantially correspond to the inner response zone(s) 306 of the current sensor response 300, and the second preconfigured response of the second magnetic field transducing device or element of transducer 106 may substantially correspond to the outer response zone(s) 308 of the current sensor 300.

In an example, the first preconfigured response of the first magnetic field transducing device or element may comprise a relatively greater sensitivity than a second preconfigured response of the second magnetic field transducing device or element. The first preconfigured response of the first magnetic field transducing device or element may comprise a relatively narrower flux density range of operation than a second preconfigured response of the second magnetic field transducing device or element. In other words, the first magnetic transducing device or element of the magnetic field transducer 106 may comprise a relatively lower saturation flux density than a saturation flux density of the second magnetic field transducing device or element of the transducer 106. The saturation flux density of at least the second magnetic field transducing device is preferably greater than the saturation flux density of the magnetic core 104. In such an embodiment, the second magnetic field transducing devices or elements collectively provide a magnetic field transducer 106 having a saturation flux density that is greater than the saturation flux density of the magnetic core 104.

A response of the magnetic field transducer 106 and/or of the current sensor 100 may substantially correspond to a combined response of the first and second magnetic field transducing elements or devices of transducer 106. The combined response may correspond to a single output electrical signal of the magnetic field transducer 106. For instance, the integrated magnetic field transducer may further comprise a summing circuit configured to sum a first signal output from the first magnetic field transducing device or element and a second signal output from the second magnetic field transducing device. The summing circuit may be configured to sum and combine the signals into a single signal. The summing circuit may comprise one or more filtering circuits configured to filter each of the first and second output signals to sum only a predetermined magnetic flux density range of each signal. For instance, a first filter operatively coupled to the output of the first magnetic field transducing device may filter the first output signal to a magnetic flux density operating range corresponding to the inner response regions 306 of the current sensor 100, or the inner response region 306 and the intermediate region 307. A second filter operatively coupled to the output of the second magnetic field transducing device may filter the second output signal to a magnetic flux density range corresponding to the outer response regions 308 of the current sensor 100, or the outer response region 308 and the intermediate region 307. In some embodiments, the summing circuit may not filter the first and second output signals but combine the signals across the sensor's full range of operation. In some embodiments, the first magnetic field transducing device or element and the second magnetic field transducing device or element of integrated transducer 106 are mounted in opposing orientations, with respect to the direction of a magnetic field generated within the air gap 114 during operation. In this manner, the output signals of the first and second magnetic field transducing devices or elements may be combined to provide a differential magnetic flux density signal. This configuration may provide a cancelation effect in terms of electrical or magnetic interferences in the system or common mode noise.

Referring back to FIG. 3, for example, the non-linear response of the current sensor 100 may comprise a first current response 302 corresponding to a relatively lower and narrower current range (or associated flux density range) of approximately 0-50 amperes, and a second current response 304 corresponding to a relatively higher and wider current range (or associated flux density range) of approximately 60-1000 amperes. In some embodiments, the lower current range may be wider, and the higher current range may be narrower. In yet another alternative implementation, the lower and upper current ranges may comprise substantially similar widths. At least one of the response regions comprises a linear response where the output is substantially proportional to the current flowing through the conductor. Preferably the response 302 of the inner response region 306 is substantially linear. The response 304 corresponding to the upper response region 308 may also be substantially linear.

The inner response region 306 and upper response region 308 preferably vary in sensitivity as shown by the varying gradients of responses 302 and 304 in FIG. 3, due to the varied sensitivity of the first and second magnetic field transducing elements or devices incorporated in the magnetic field transducer 106. The inner response region 306 preferably comprises a response 302 having a higher sensitivity relative to sensitivity of the response 304 of the outer response region 308. An intermediate response region 307 may comprise a non-linear response. The sensitivity of the response in this region 307 may also be varied relative to responses 302 and 304. Furthermore, the inner response region 306 may comprise a response 302 having a higher degree of accuracy and/or sensitivity relative to the response 304 of the upper response region 308, and the response of the region 307. In this manner, low currents, e.g., 0-50 Amps may be measurable by the current sensor 100 with relatively high resolution and accuracy for performing functions such as monitoring and analysis of conductor/circuit current requiring such resolution and accuracy. On the other hand, high currents, e.g., 50-1000 Amps may be measurable by the current sensor 100 with relatively lower resolution and accuracy for performing other functions that require detection of high currents, but where sensitivity, resolution and/or accuracy is non-essential to the performance of that function. A safety function such as overcurrent protection in a circuit may be an example where an indication of a high magnitude current above a predetermined threshold may be sufficient to elicit a safety response, such as the disconnection of power from a circuit carrying the high current.

In the exemplary implementations where the magnetic field transducer 106 comprises multiple magnetic field transducing devices or elements, providing distinct output electrical signals, the magnetic field transducing devices or elements are preferably closely associated with one another and locate, preferably entirely, within a common magnetic core 104 to thereby receive a same or substantially the same concentrated magnetic flux density from the magnetic core 104, and also such that they are exposed to substantially the same surrounding magnetic field generated by the current through the conductor 102, during operation. Accordingly, they provide an output signal that is indicative of the same magnetic field.

In yet another exemplary implementation, the integrated magnetic field transducer 106 may comprise one magnetic field transducing surface or element or multiple active surfaces or elements having a same or similar response across the full range of operation of the magnetic field transducer 106. In such an implementation, the response 300 may still comprise at least two response zones 306 and 308 having responses 302 and 304 respectively, with distinct sensitivities, due at least in part to the saturation flux density of the magnetic core 104 being lower than the magnetic flux density of the magnetic field transducer 106. One or both responses 302 and 304 may be substantially linear. The response 300 may still comprise a non-linear response zone, such as 307 with a substantially non-linear response 303.

The magnetic core 104 comprises one or more grounding legs extending laterally from the open end 112 of the magnetic core 104 to enable magnetic and electrical grounding of the magnetic core 104 in situ. The leg(s) may extend laterally from one wall 108a/108b or they may extend from both walls 108a and 108b. In an embodiment, a pair of legs extend from either side of each wall (only 118a, 118b and 118c are shown in FIG. 1A). In situ, the legs are connected to a grounding or other common reference surface, component or substrate, to thereby magnetically and electrically ground the magnetic core 104. This may be a solid or direct grounding, which comprises a direct connection via a low-resistance pathway from the magnetic core to the ground or common reference point. Alternatively, the grounding may be a soft grounding comprising a connection to ground or a common reference point in the electrical system via an impedance. The effects of grounding can be seen in FIG. 4B. As shown in FIG. 4A, the magnetic core 104 has the effect of reducing the current sensor's 100 susceptibility to stray and other external magnetic fields 402. In a power distribution panel or system application, for example, multiple, closely associated busbars, may cause stray fields to extend to the current sensor 100 and affect the output of the sensor. During operation, stray magnetic fields 402 are trapped by the magnetic core 104 and this effectively bypasses the magnetic field transducer 106. Some of the trapped stray magnetic fields 402 may be concentrated towards the magnetic field transducer 106.

Referring to FIG. 4B, another function of grounding the magnetic core 104 is to ground out electrostatic currents resulting from parasitic capacitances that may form between the closely associated magnetic core 104 and conductor 102.

Referring to FIG. 5, in an embodiment, the present disclosure comprises a current detection circuit or device 500 electrically connected to, or forming a part of, the current sensor 100 as per the embodiments described in relation to FIG. 1-3 or any other embodiment of a current sensor (e.g., 100A or 160) described further on in this specification. The circuit or device 500 is operatively coupled to a conductor 102 for determining an indication of current flowing through the conductor 102, in use. The circuit or device 500 comprises a monitoring or measurement device comprising an electronic memory 506 and a processing device 504 or other computing device operatively coupled to the memory 506. Memory 506 may comprise a database or other electronic storage medium or media that may form part of or that may be accessible by the processing device 504, as is known in the art. The response of the current sensor 100 e.g., response 300 of FIG. 3 may be preconfigured and predetermined, with data indicative of the response 300 prestored in electronic memory 506 to enable the processing device 504 to measure or determine an indication of the current through the conductor 102 based on the electrical signal output from the current sensor 100 and based on the prestored response data.

The output of the current sensor 100 may be operatively connected to the processing device 504 via an input/output interface 502. The current sensor 100 output may be a digital output, or it may be an analogue output that is digitised by the processing device 504 or associated circuitry. For example, the input/output interface 502 may comprise an analogue to digital converter. The data indicative of the current sensor response stored in memory 506 indicates a value of the conductor current for a given output of the current sensor (which may be a voltage or current output for instance). This relationship could be stored in the form of a look-up table, or as one or more mathematical algorithms or polynomial functions accessible and executable by the processing device 504, so the processing device 504 may perform mathematical or signal processing to transform data indicative of the sensor's output electrical signal into data that is indicative of the current in the conductor. Accordingly, during operation, as a current flows through the conductor 102, the value of the current generates an output signal in the current sensor 100. The output signal is digitised, and the corresponding digital value representative of the output is then processed by the processing device 504, and based on the pre-stored response data, an indication of the current through the conductor 102 is determined. The value of the current through the conductor may be stored in electronic memory for later access and/or processing by the same or a different circuit/system, or it may be used to generate another output signal for driving another part of the circuit for instance.

In an example implementation of circuit 500, the current sensor 100 may be configured to comprise a non-linear response including a lower current response 302 and a higher current response 304. The lower current response 302 may provide a higher sensitivity response that is suitable for monitoring the current through the conductor 102. In a power distribution system application for instance, such conductor current monitoring may be useful in monitoring a load circuit connected to a power distribution panel. Higher sensitivity within this response region is desirable for load monitoring as it can provide a more accurate representation of load activity. In this manner, the processing device 504 may store the value of the monitored current within lower current region 306 in memory, and/or may generate a signal indicative of the current value and send the signal to another circuit or part of the system that may appropriately respond to the signal.

The higher current response 304 may provide a relatively lower sensitivity but may still be useful for identifying high current conditions that may lead to a fault in the power distribution panel or connected load circuit. This could be used to prevent a fault condition or protect circuits after detection of the fault condition. In this manner, the processing device 504 may be further configured to generate a fault signal upon detection of a current value within the higher current region 308, and accordingly send the fault signal to a trip device or other circuit of the system that may appropriately respond to the signal.

Figure 7A:
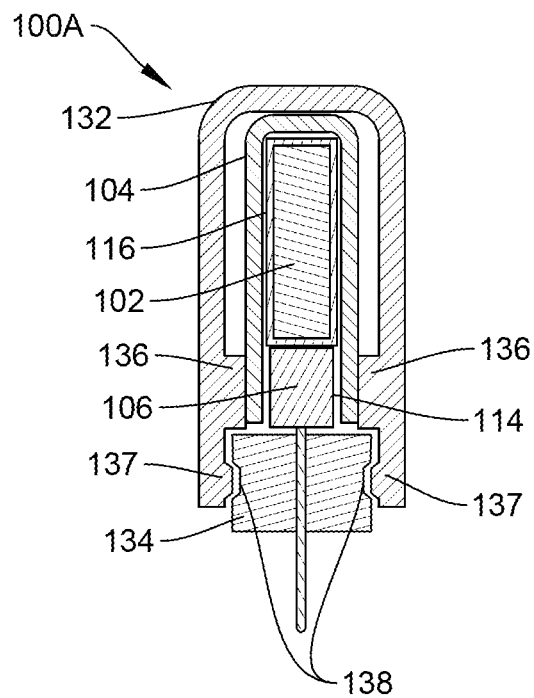
FIG. 7A is a side view of a further embodiment of a current detection device of the present disclosure.
Figure 7B:
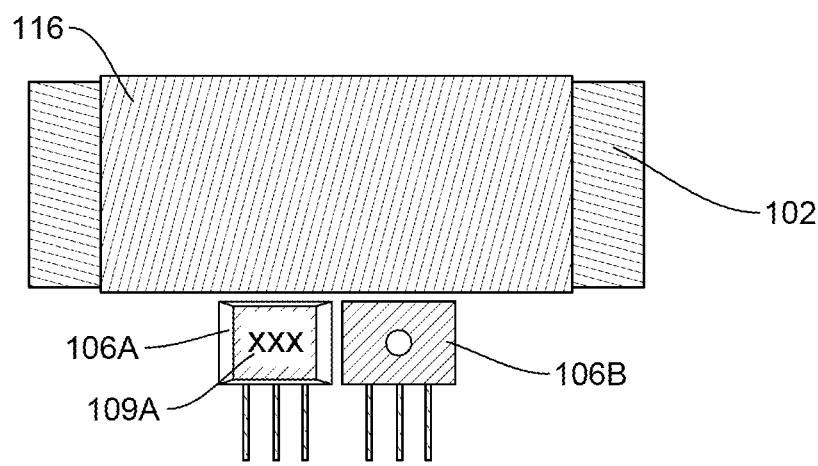
FIG. 7B is a front view of the current detection device of FIG. 7A showing the conductor, conductor insulation, and magnetic field transducing devices only.
Figure 7C:
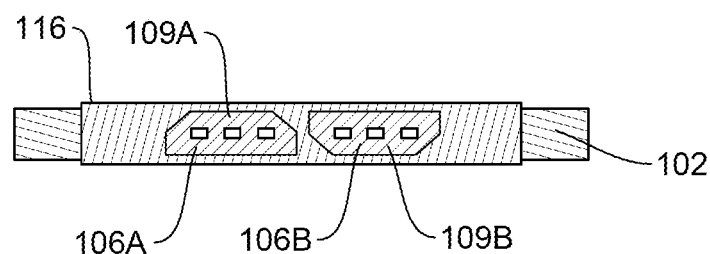
FIG. 7C is a bottom view of the current detection device of FIG. 7A showing the conductor, conductor insulation and magnetic field transducing devices only.

Referring to FIGS. 7A-7C a modification of the current sensor 100 is shown and has been labelled current sensor 100A. Only features that differ or have been modified are described herein for the sake of brevity. Unless stated otherwise, all other features of current sensor 100 described in this specification also apply to current sensor 100A. In this modification, the sensor 100A comprises an electrically insulating housing 132 that at least partially encapsulates the magnetic core 104, the conductor 102 and the magnetic field transducer(s) 106. The housing 132 preferably fully encapsulates the magnetic core 104 and the magnetic field transducer(s) 106 and encapsulates a length of the conductor 102 that extends through the magnetic core 104. The housing 132 is preferably formed from an electrically insulating material, such as a plastics material or a metal material that is non-ferrous. The housing 132 may be bonded to an external periphery of the magnetic core 104 using a suitable adhesive. Alternatively, or in addition, the housing may be coupled over the magnetic core 104 and comprises a retention mechanism for holding the magnetic core in place relative to magnetic field transducer(s) 106 and/or the base 134. For example, the housing may be formed from substantially rigid materials, and comprise opposing legs that may be resiliently flexible to allow the housing 132 to clip over the magnetic core 104 and fix the housing and core into position. One or both legs may also comprise inwardly extending protrusions or retention blocks 136 configured to locate adjacent the air gap interface 114 of the magnetic core 104, in situ. The retention blocks 136 secure and maintain the positions of the opposing walls of the magnetic core 104 at the air gap interface 114. This serves to maintain the dimensions of the air gap interface 114 at the open end of the core 104. The ends of the legs of the housing may couple to the base 134 using a suitable coupling mechanism. A snap-fit mechanism comprising complementary formations 137/138 formed in one or more inner surfaces of the housing 132 and one or more complementary surfaces of the base 134 may be implemented, for instance. Other coupling or retention mechanisms could be implemented for coupling the housing 132 over the magnetic core 104 and to the base 134 couple be implemented, as would be readily understood by the person skilled in the art. The housing may comprise a complementary shape to the shape of the magnetic core 104 to substantially fully encapsulate the magnetic core 104.

The current sensor 100A in this modification further comprises a base or substrate 134 for mounting and positioning the magnetic field transducer(s) 106 of the current sensor 100A. The housing 132 may fixedly couple to the base 134 to fix the position of the core 104 relative to the base 134. The base 134 preferably comprises preconfigured mounting locations for positioning the magnetic core 104 on the base 134. The base 134 may comprise one or more mounts or connections for the magnetic field transducer(s) 106 to fixedly couple the transducer(s) 106 and locate the transducer(s) 106 within the air gap interface 114 of the magnetic core 104. Accordingly, the base is configured to locate directly adjacent the air gap interface 114.

The current sensor 100A comprises a magnetic field transducer structure 106 comprising multiple magnetic field transducing devices 106A and 106B, each configured to output a distinct electrical signal corresponding to the detected/transduced magnetic flux density. The devices may be integrated into a single device that is mounted on the base or substrate 134, or they may be separate devices separately mounted adjacent one another on base or substrate 134. The operation of the magnetic field transducing devices 106A and 106B may be as described in relation to the variation of current sensor 100 with multiple the first and second magnetic field transducing devices of transducer 106 implemented. Each magnetic field transducing device 106A and 106B is mounted on the base 134 and extends from the base 134 into the air gap interface 114. Both devices 106A and 106B comprise active transducing surfaces or elements that locate substantially entirely within the air gap interface 114. In some embodiments, the devices 106A and 106B may be located only partially within the air gap interface 114. The devices are arranged in close proximity to one another so that they may be exposed to the same magnetic field during operation. In the embodiment shown, both devices 106A and 106B extend adjacent a narrow side 102A of the conductor 102.

The magnetic field transducing devices 106A and 106B are arranged in opposing orientations relative to one another, such that the polarities of their output signals are reversed. For instance, a first magnetic field transducing device 106A may have an active transducing surface 109A facing in a first direction and the second magnetic field transducing device 106B may have an active transducing surface 109B facing in an opposing, second direction (not shown and facing in an opposite direction in FIG. 7B). The first and second active surfaces 109A, 109B may be substantially normal to a direction of a magnetic field generated across the air gap interface 114, in use. In other words, the active surfaces may be substantially parallel to inner walls of the magnetic core 104 at the air gap interface 114 to maximise the accuracy and/or sensitivity of the response of the transducers in the presence of a magnetic field.

As mentioned in relation to current sensor 100, in such a configuration, each magnetic field transducing device 106A, 106B may comprise a distinct response with a first device 106A having a response of higher sensitivity relative to the other device 106B. The saturation flux density of each device 106A and 106B may also differ. Preferably at least the second device 106B comprises a saturation flux density that is greater than the saturation flux density of the magnetic core 104.

Figure 8A:
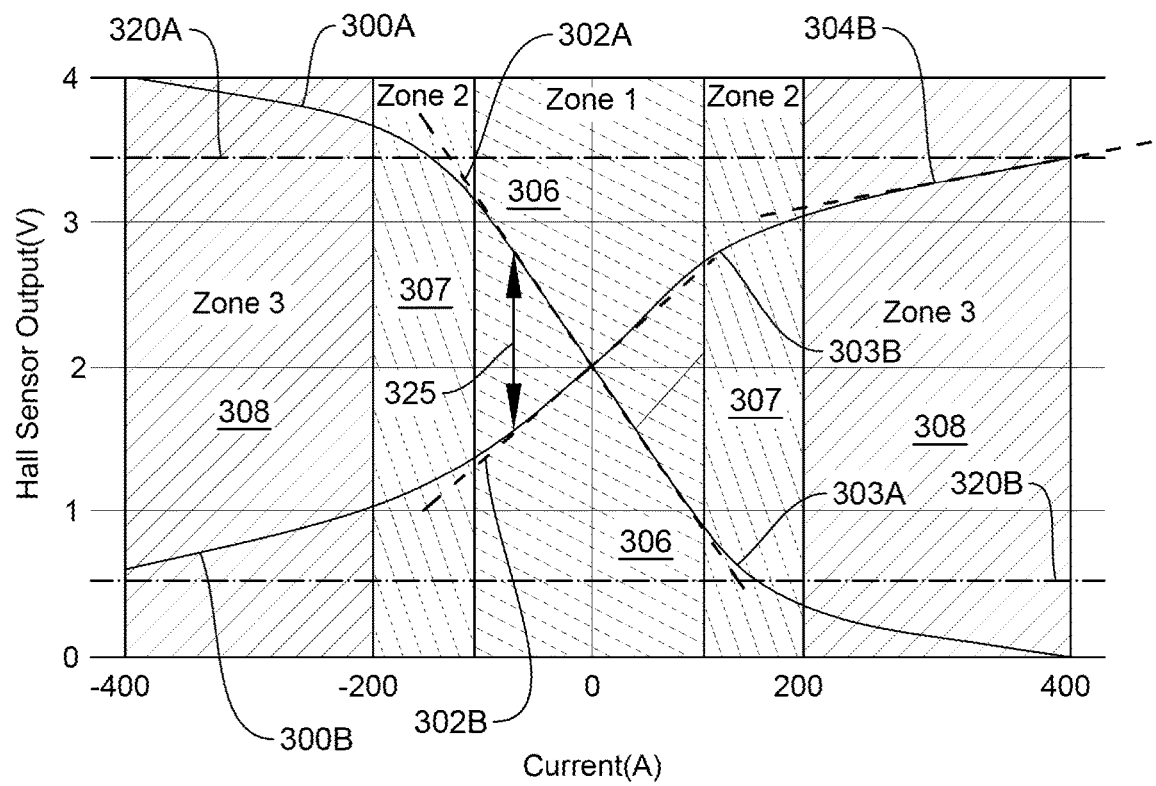
FIG. 8A is a graph illustrating exemplary responses of the magnetic field transducing devices of the current detection device of FIG. 7A.

Referring to FIG. 8A, the response of the first and second magnetic field transducing devices 106A and 106B in the presence of a magnetic core 104 saturating in the second response zone(s) 307 is shown. The devices 106A and 106B comprise first and second preconfigured responses 300A and 300B that are distinct and varied at least in terms of sensitivity. Although in some embodiments, the sensitivity may be the same or similar. The first magnetic field transducing device 106A comprises a response 300A having a substantially linear response 302A of relatively high sensitivity in response zone(s) 306. The second magnetic field transducing device 106B comprises a response 300B including a substantially linear response 302B of relatively lower sensitivity in response zone 306. The first response zone 306 may correspond to an absolute current magnitude range of approximately 0-50 Amps, or 0-100 Amps in conductor 102, for instance. Response zone(s) 307 correspond to the magnetic flux density range at which the magnetic core 104 magnetically saturates, e.g., at or around 100 Amps in this example. Accordingly, both responses 300A and 300B exhibit a non-linear response 303A, 303B in this zone 307.

At least the second magnetic field transducing device 106B comprises a saturation flux density that exceeds the saturation flux density of the magnetic core 104. Preferably both magnetic field transducing devices 106A and 106B comprise saturation flux densities that exceed that of the core 104. The sensitivity and saturation flux density of magnetic field transducing device 106B is such that the device 106B does not magnetically saturate within the operating range of the current sensor, e.g., 0-500A, or 0-1000A. Accordingly, in an outer response zone 308, the response 300B may comprise a substantially linear response 304B, albeit with potentially lower accuracy than the response component 302B. The response 300A of the first device 106A in the outer response zone 308 may saturate due to the limits of the maximum and minimum operating voltages 320A, 320B of the device 106A.

Figure 8B:
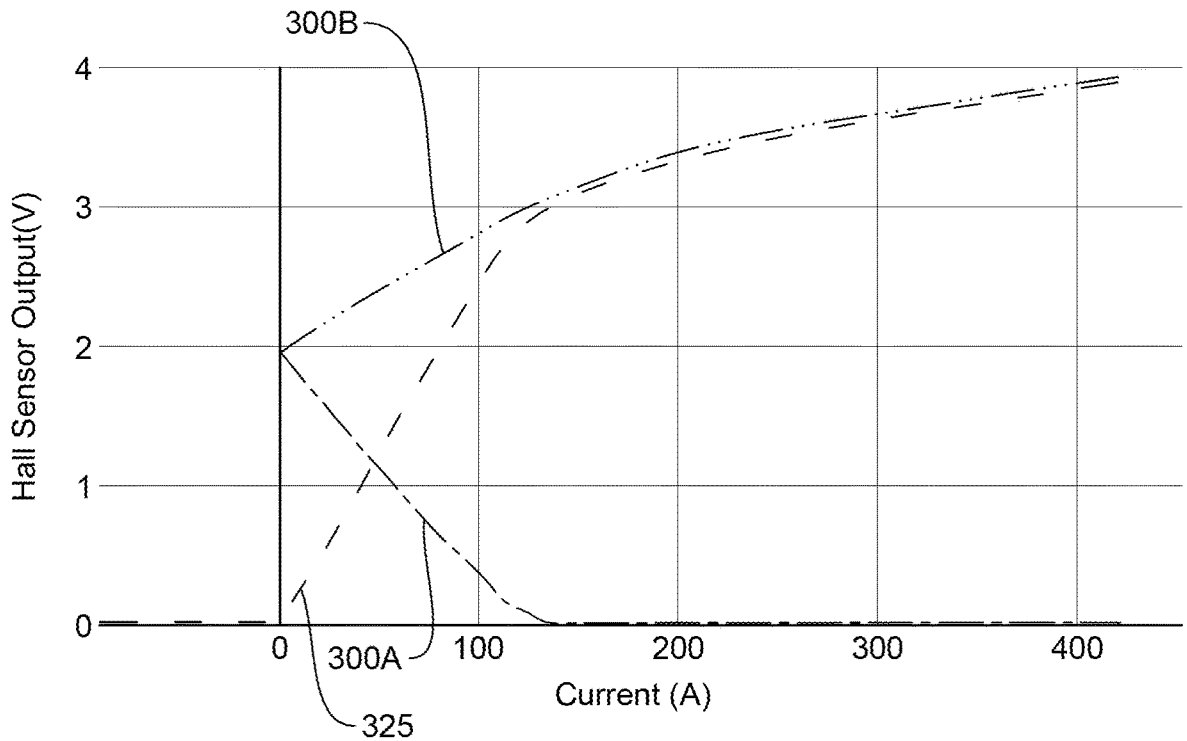
FIG. 8B is a graph illustrating an exemplary differential current response for positive polarity currents only, for the current detection device of FIG. 7A.
Figure 9A:
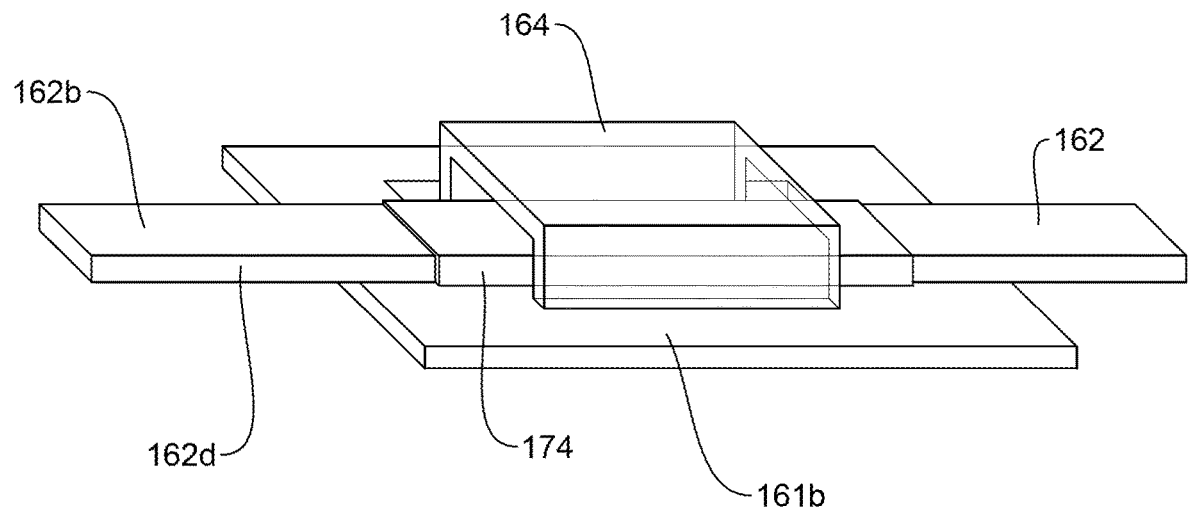
FIG. 9A is a top perspective view of a further embodiment of a current detection device of the present disclosure.
Figure 9B:
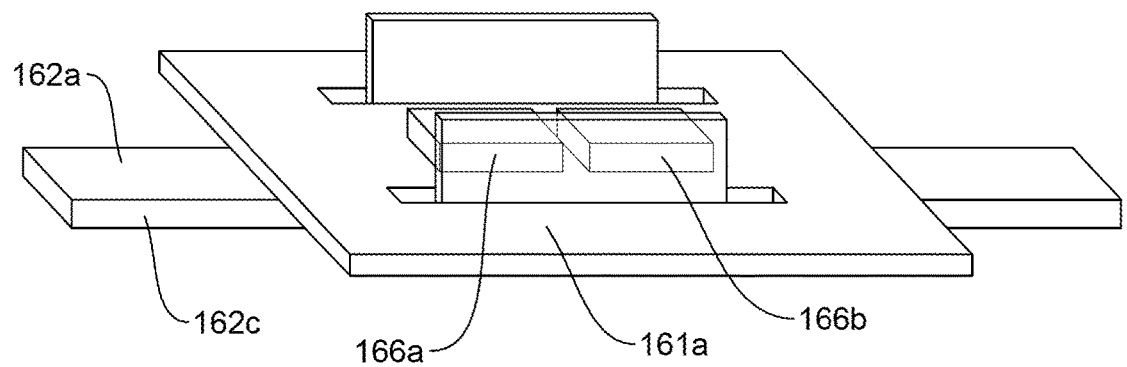
FIG. 9B is a bottom perspective view of the current detection device of FIG. 9A.
Figure 9C:
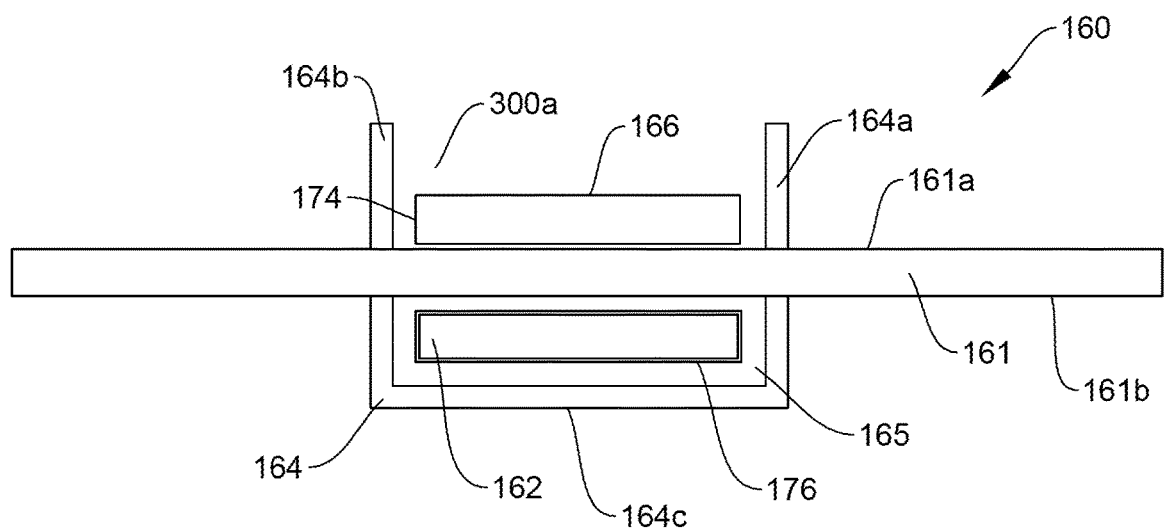
FIG. 9C is a cross-sectional view of the current detection device of FIG. 9A.
Figure 9D:
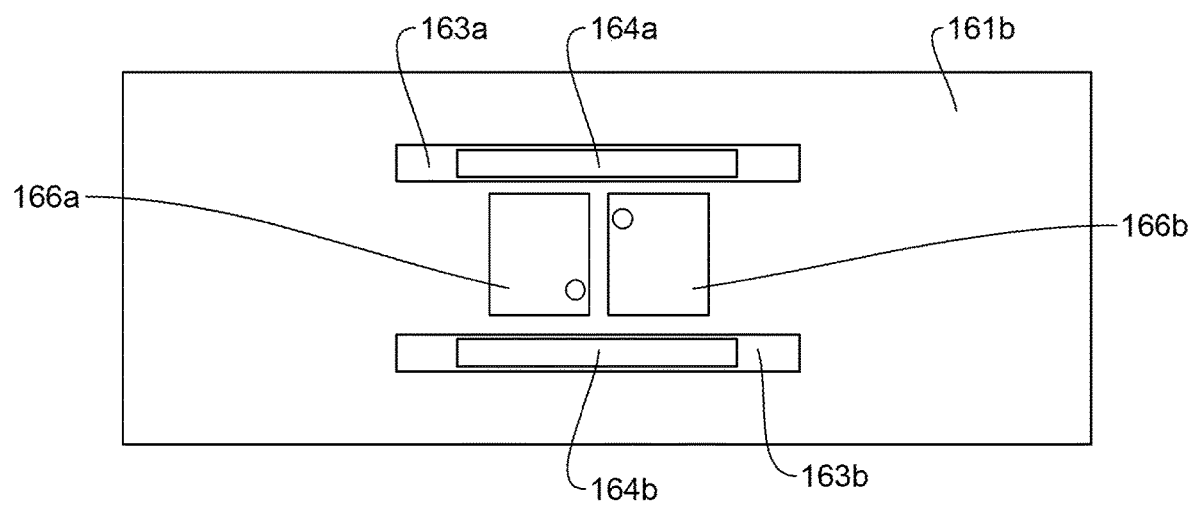
FIG. 9D is a bottom view of the current detection device of FIG. 9A.

Referring also to FIG. 8B, in this exemplary implementation of current sensor 100A, the magnetic field transducing devices 106A and 106B are configured to output multiple electrical signals of opposing polarities such that a differential flux density or current measurement may be obtained from the signals. Accordingly, the current sensor 100A may be further configured to determine or output a differential value of current or magnetic flux density from the output signals of magnetic field transducing devices 106A and 106B, resulting a differential current (or magnetic flux density) response 325 of the current sensor 100A. A measure of the current in conductor 102 may be determined based on the differential value. A differential value of the current/magnetic flux density may also improve the effective sensitivity and/or resolution of the current sensor 100 due to the increased gain from two transducers 106A and 106B, at least in the response zone 306 before the first magnetic field transducing device 106A saturates. Operating in a differential mode could also make detecting the zero crossing of an AC waveform easier.

For instance, as shown in FIG. 8B in this exemplary embodiment, and with reference to the positive polarity of the response only, the response 325 initially exhibits a substantially linear or near linear response, having a substantially (and relatively) steep gradient indicating a relatively high sensitivity. Changes in the conductor current result in proportional and relatively larger increases in the sensor's output in this region, corresponding to region 306 in FIG. 8A. As the conductor current continues to rise, saturation of the magnetic core 104 begins to impose a non-linear curve that gradually inclines and reduces in slope. This response corresponds to region 307 in FIG. 8A. As the magnetic core 104 fully saturates, the curvature of the response 325 settles into a substantially linear or near linear response, with a relatively shallower gradient compared to the response 325 at region 306. This response corresponds to the response in region 308 of FIG. 8A. Finally, as the conductor current 100 continues to rise beyond the saturation knee point of both magnetic field transducing devices 106A and 106B, the response 325 evolves again into a gentler, more gradual incline which then transitions into an even shallower slope forming a plateau corresponding to saturation of the sensor 100A. The sensor's response becomes increasingly resistant to further input changes, and any additional increase in the conduct current results in minimal changes in the output in and beyond this region 310. The negative polarity side of the response 325 preferably mirrors the same shape and characteristics as the positive polarity side, but exhibits an inverted polarity. In other words, as the input decreases in magnitude or becomes negative, the sensor's output follows an equivalent curve, but with the opposite direction or sign of the output value. This symmetry ensures that the sensor's response maintains a consistent profile regardless of whether the input is positive or negative.

The transducing device 106A may comprise a saturation flux density that is substantially equal to or similar to the saturation flux density of the magnetic core 104. In some embodiments, the saturation flux density of the transducing device 106A is greater than that of the magnetic core 104 but substantially lower than that of magnetic field transducing device 106B. In some implementations the saturation flux density of transducing device 106A may be slightly lower than that of the magnetic core 104, but preferably not significantly lower to maintain a substantially linear response across the majority of region 306.

It will be appreciated that although a second magnetic field transducing device 106A, having a higher sensitivity response 300A may be preferred for certain applications requiring an even greater sensitivity in a low current region 306, this transducing device 106A may be omitted in certain implementations. Referring back to FIG. 8A in an exemplary embodiment where only a single transducer 106B, or a single type of transducer 106B is implemented in the current sensor 100A, the response of the sensor 100A may correspond to the response 300B of FIG. 8A. In this example, the magnetic field transducing device 106B comprises a saturation flux density that is substantially greater than the saturation flux density of the magnetic core 104. This results in a response 300B across the full range of operation that is substantially non-linear. The non-linear response comprises a first substantially linear response component in region 306, an intermediate, non-linear response component in region 307, and another substantially linear response component in region 308. The response component of region 308 corresponds to substantially higher current/flux density levels observed or detected by the magnetic field transducer and a lower sensitivity response component, relative to the current/flux density levels and sensitivity of the response component in region 306. Tailoring or tuning of the relative saturation flux densities of the transducers 106A, 106B and the magnetic core 14, adjusts the response curves 300A, 300B to achieve desired response components and ranges in regions 306, 307 and 308.

The response 300B initially exhibits a substantially linear or near linear response, having a substantially (and relatively) steep gradient indicating a relatively high sensitivity. Changes in the conductor current result in proportional and relatively larger increases in the sensor's output in this region, corresponding to region 306 in FIG. 8A. As the conductor current continues to rise, saturation of the magnetic core 104 begins to impose a non-linear curve that gradually inclines and reduces in slope. This response corresponds to region 307 in FIG. 8A. As the magnetic core 104 fully saturates, the curvature of the response 300B settles into a substantially linear or near linear response, with a relatively shallower gradient compared to the response 300B at region 306. This response corresponds to the response in region 308 of FIG. 8A. Finally, as the conductor current 100 continues to rise beyond the saturation knee point of both magnetic field transducing devices 106A and 106B, the response 325 evolves again into a gentler, more gradual incline which then transitions into an even shallower slope forming a plateau corresponding to saturation of the sensor 100A. The sensor's response becomes increasingly resistant to further input changes, and any additional increase in the conduct current results in minimal changes in the output in and beyond this region 310. The negative polarity side of the response 300B preferably mirrors the same shape and characteristics as the positive polarity side, but exhibits an inverted polarity. In other words, as the input decreases in magnitude or becomes negative, the sensor's output follows an equivalent curve, but with the opposite direction or sign of the output value. This symmetry ensures that the sensor's response maintains a consistent profile regardless of whether the input is positive or negative.

It will be appreciated that although the responses 300, 300A, 300B and 325 of the embodiments described herein have been shown in the figures with reference to a current parameter (Amps), corresponding magnetic flux density responses may be associated with the magnetic field transducer or magnetic field transducing devices of any of the embodiments described herein, as would be apparent to the person skilled in the art. Such responses are intended to be included within the scope of the present disclosure as herein described and claimed.

In some implementations, the current sensor 100A may comprise more than two magnetic field transducing devices, coupled within the air gap interface 114 of the common core 104, and the devices providing distinct output signals that collectively can be used to provide a current sensor response that is tuned for the target application. For instance, there may be two pairs of magnetic field transducing devices, each pair being oriented in one of two opposing directions.

The current sensor 100A may be configured to output a single output signal indicative of the current in the conductor, such as a signal with the differential current response 325, or in other implementations the current sensor 100A may comprise multiple output corresponding to the signals output by multiple transducers 106A and 106B, and having response profiles 300A and 300B, respectively. In the latter implementation, a current detection circuit or device implementing the current sensor 100A may comprise a processing device configured to process the multiple output electrical signals to determine an indication of the current in the conductor based on those signals. This may comprise a determination of a differential current signal or data indicative thereof by the processing device, as per response 325 described above.

Referring back to FIG. 5, for instance, the current detection circuit or device 500 may be electrically connected to, or forming a part of, the current sensor 100A instead of current sensor 100. Current sensor 100A may comprise a single output for outputting a signal or data indicative of conductor current, corresponding to a combined or differential signal from multiple transducing device outputs. Alternatively, it may comprise multiple output for outputting multiple signals or data indicative of conductor current, each one corresponding to a distinct transducing device output. The circuit or device 500 is operatively coupled to a conductor 102 for determining an indication of current flowing through the conductor 102, in use. The circuit or device 500 comprises a monitoring or measurement device comprising an electronic memory 506 and a processing device 504 or other computing device operatively coupled to the memory 506. Memory 506 may comprise a database or other electronic storage medium or media that may form part of or that may be accessible by the processing device 504, as is known in the art. The response of the current sensor 100A comprising a combined response of the magnetic field transducer outputs, e.g., differential current response 325, may be preconfigured and predetermined, with data indicative of the response 325 prestored in electronic memory 506 to enable the processing device 504 to measure or determine an indication of the current through the conductor 102 based on the one or more electrical signal(s) output from the of current sensor 100A and based on the prestored response data.

The output(s) of the current sensor 100A may be operatively connected to the processing device 504 via an input/output interface 502. The current sensor 100A output(s) may be digital output(s), or they may be analogue output(s) that is(are) digitised by the processing device 504 or associated circuitry. For example, the input/output interface 502 may comprise one or more analogue to digital converter(s). The data indicative of the current sensor response 325 stored in memory 506 indicates a value of the conductor current for given output(s) of the current sensor (which may be a voltage or current output for instance). This relationship could be stored in the form of a look-up table, or as one or more mathematical algorithms or polynomial functions accessible and executable by the processing device 504, so the processing device 504 may perform mathematical or signal processing to transform data indicative of the sensor's output electrical signal(s) into data that is indicative of current in the conductor. The value of the current through the conductor may be stored in electronic memory for later access and/or processing by the same or a different circuit/system, or it may be used to generate another output signal for driving another part of the circuit for instance.

In an example implementation of circuit 500, the current sensor 100A may be configured to comprise a non-linear response 325 including a lower current response and a higher current response. The lower current response may provide a higher sensitivity response that is suitable for monitoring the current through the conductor 102. In a power distribution system application for instance, such conductor current monitoring may be useful in monitoring a load circuit connected to a power distribution panel. Higher sensitivity within this response region is desirable for load monitoring as it can provide a more accurate representation of load activity. In this manner, the processing device 504 may store the value of the monitored current within lower current region 306 in memory, and/or may generate a signal indicative of the current value and send the signal to another circuit or part of the system that may appropriately respond to the signal.

The higher current response may provide a relatively lower sensitivity but may still be useful for identifying high current conditions that may lead to a fault in the power distribution panel or connected load circuit. This could be used to prevent a fault condition or protect circuits after detection of the fault condition. In this manner, the processing device 504 may be further configured to generate a fault signal upon detection of a current value within the higher current region 308, and accordingly send the fault signal to a trip device or other circuit of the system that may appropriately respond to the signal.

Referring to FIGS. 9A-9D, a further embodiment of a current detection device or structure 160 (herein current sensor 160) of the present disclosure is shown, having a compact structure formed from surface mounted and integrated electronic components. This current sensor 160 may be alternatively implemented in circuit or device 500 as per sensor 100A described above. The current sensor 160 is operative in accordance with the same operational principles herein described in relation to the current sensor 100 or any of its modification. Accordingly, the operation of the sensor 160 will not be described in detail herein. The structure of this sensor 160 comprises a printed circuit board or substrate 161, on which integrated magnetic field transducer device(s) 166, a magnetic core 164 and an electrical conductor 162 is(are) mounted.

The substrate 161 is formed from an insulating material as is known in the art, such as fibreglass or epoxy resin, with conductive pathways (e.g., copper traces) etched or printed on one or both major surfaces 161a, 161b of the substrate 161. The substrate 161 serves as a platform for mounting and interconnecting various electrical components of or relating to the sensor 160. The substrate 161 may, for instance, form part of a device incorporating the current sensor 160 wherein other electrical components and circuits are connected to the sensor 160. For instance, the example implementation, as shown in FIG. 5, or the implementations shown in FIG. 12, may comprise other processing devices, disconnect devices, communication devices, and/or user interface devices also mounted and electrically connected on the substrate 161. Each device or component may be mounted on one of the substrate surfaces 161a, 161b as is known in the art.

The substrate 161 comprises a pair of spaced and substantially parallel openings 163a, 163b, through which parallel sides or legs 164a, 164b of the magnetic core 164 extend. An open end of the magnetic core 164 forms an air gap interface 174 at side 161a of the substrate 161. The magnetic field transducer device(s) 166 is(are) mounted on the major surface side 161a of the substrate 161 to locate within the air gap interface 174. On an opposing major surface side 161b of the substrate 161, a channel 165 is formed between the substrate 161 and the closed end of the magnetic core 164. The conductor 162 extends longitudinally within the channel 165 between the substrate surface 161b and the closed end 164c of the magnetic core 164.

A layer of electrically insulating material 176 closely encapsulates at least a part of the length of the conductor 162. The layer of insulating material 176 may be coupled directly about an outer surface of the conductor 162 to cover all faces of the conductor along at least a portion of the length of the conductor 162. The layer of insulating material 176 may be overmoulded onto the conductor 162. The portion of the conductor 162 encapsulated with the insulating material 176 preferably comprises a length that corresponds at least to the length of the receiving channel 165.

The conductor 162 is substantially planar and comprises two opposing major sides or faces 162a, 162b and two opposing narrow sides or faces 162c, 162d connecting between the major sides or faces 162a, 162b. In this embodiment, the air gap interface 174 and magnetic field transducing device(s) 166 locate adjacent to and align with a major, wide face 162a of the conductor 166, as opposed to the narrow side as shown with respect to current sensor 100. Although, it will be appreciated in alternative configurations the air gap interface 174 and magnetic field transducing device(s) 166 could be aligned with a narrow side 162c, 162d of the conductor 166. The magnetic field transducer(s) 166 locate on an opposing side 161a of the substrate 161 to the conductor 102. In some implementations, the conductor 102 and magnetic field transducer(s) 166 may locate on the same side 161b of the substrate 161.

The magnetic core 164 comprises a substantially U-shaped cross-section as per the core 102 described in relation to the current sensors 100, 100A. The material composition, number of layers, and/or operating characteristics of the core 164 may be as described in relation to core 102. In this embodiment, the channel 165 formed between the parallel legs 164a, 164b or sides is substantially wide to couple the closed end of the core 164 over the wide face 162b of conductor 162. Each leg or side 164a, 164b preferably comprises a substantially planar plate. The legs or sides 164a, 164b preferably extend in close proximity to the narrow sides 162c, 162d of the conductor 162. The closed end 164c of the core 164 preferably comprises a substantially planar plate connecting the legs at one end. The closed end 164c preferably extends in substantially close association with an over the major face or side 162b of the conductor 162.

The magnetic field transducing structure may comprise one or multiple magnetic field transducing devices 166. The structure may comprise multiple magnetic field transducing devices 166a, 166b, each configured to generate distinct output electrical signal indicative of a magnetic field in their presence. The multiple devices 166a, 166b may be integrated into a single magnetic field transducer 166. The transducer may comprise processing circuitry to process the multiple signals corresponding to the multiple devices 166a, 166*b* and output a single electrical signal representative of the multiple device outputs. For example, the transducer 166 may comprise the processing device configured to receive the multiple device outputs and to generate or determine a single output signal representative of the multiple inputs, such as a combined or differential flux density signal. Alternatively, the integrated transducer 166 may comprise multiple outputs corresponding to the outputs of the multiple transducing device(s) 166*a*, 166*b* and a processing device, may be separately integrated and electrically connected to the outputs for generating or determining an output corresponding to the multiple transducer device outputs. In yet another alternative, each device 166*a*, 166*b* may be separately integrated and the output of each device electrically connected to a common processing device.

Each magnetic field transducing device 166*a*, 166*b* may comprise a corresponding magnetic field transducing element or surface. The magnetic field transducing elements or surfaces of the multiple devices 166*a*, 166*b* may be oriented to output electrical signals having the same or different polarities with respect to a common magnetic field in their presence. The functionality and operating principles relating to these two alternative configurations have been described with reference to current sensor 100 or 100A and their variations, and will not be repeated for current sensor 160 for the sake of brevity. In an exemplary implementation of current sensor 160, when multiple transducing devices 166*a*, 166*b* are provided, the corresponding magnetic field transducing elements or surfaces of the devices 166*a*, 166*b* are oriented in opposition to one another so that a differential measure of current/magnetic flux density may be detected or determined based off of the respective transducing device outputs. A processing device may be implemented to determine an indication of differential current. In alternative configurations, the devices 166*a*, 166*b* are arranged such that their respective transducing elements or surfaces are in a same orientation such that the electrical outputs of the devices have the same polarity in the presence of the same magnetic field, and a processing device may be configured to determine an indication of summed current/magnetic flux density or an indication of differential current/magnetic flux density from the magnetic field transducing device outputs.

The current sensor 160 may be configured to output a single output signal indicative of the current in the conductor, such as a signal with the differential current response 325 similar to that of sensor 100A, or in other implementations the current sensor 160 may comprise multiple output corresponding to the signals output by multiple transducers 166A and 166B, and having response profiles 300A and 300B similar to those of transducers 106A and 106B respectively. In the latter implementation, a current detection circuit or device implementing the current sensor 160, such as circuit 500, may comprise a processing device configured to process the multiple output electrical signals to determine an indication of the current in the conductor based on those signals. This may comprise a determination of a differential current signal or data indicative thereof by the processing device, as per response 325 described above. In yet another alternative implementation, the current sensor 160 may comprise a single transducer 166B or a multiple transducers 166B having a same or similar response 300B and a response profile as described in relation to a similar implementation for current sensor 100A having a single type of transducer 106B.

As mentioned, the implementation of current sensor 160 may be more compact relative to sensor 100, facilitating the reduction of hardware footprint/real-estate, when implemented in a device. The compact implementation may also allow for a single or dual layer magnetic core 104 with respect to certain applications, further reducing cost and complexity of manufacture.

An exemplary method of manufacturing a current sensor structure as described above may comprise the step of coupling a magnetic field transducer at least partially within a channel or air gap interface of a magnetic core, wherein the magnetic core is configured to magnetically saturate at a lower absolute magnetic flux density magnitude relative to the magnetic field transducer.

Figure 10:
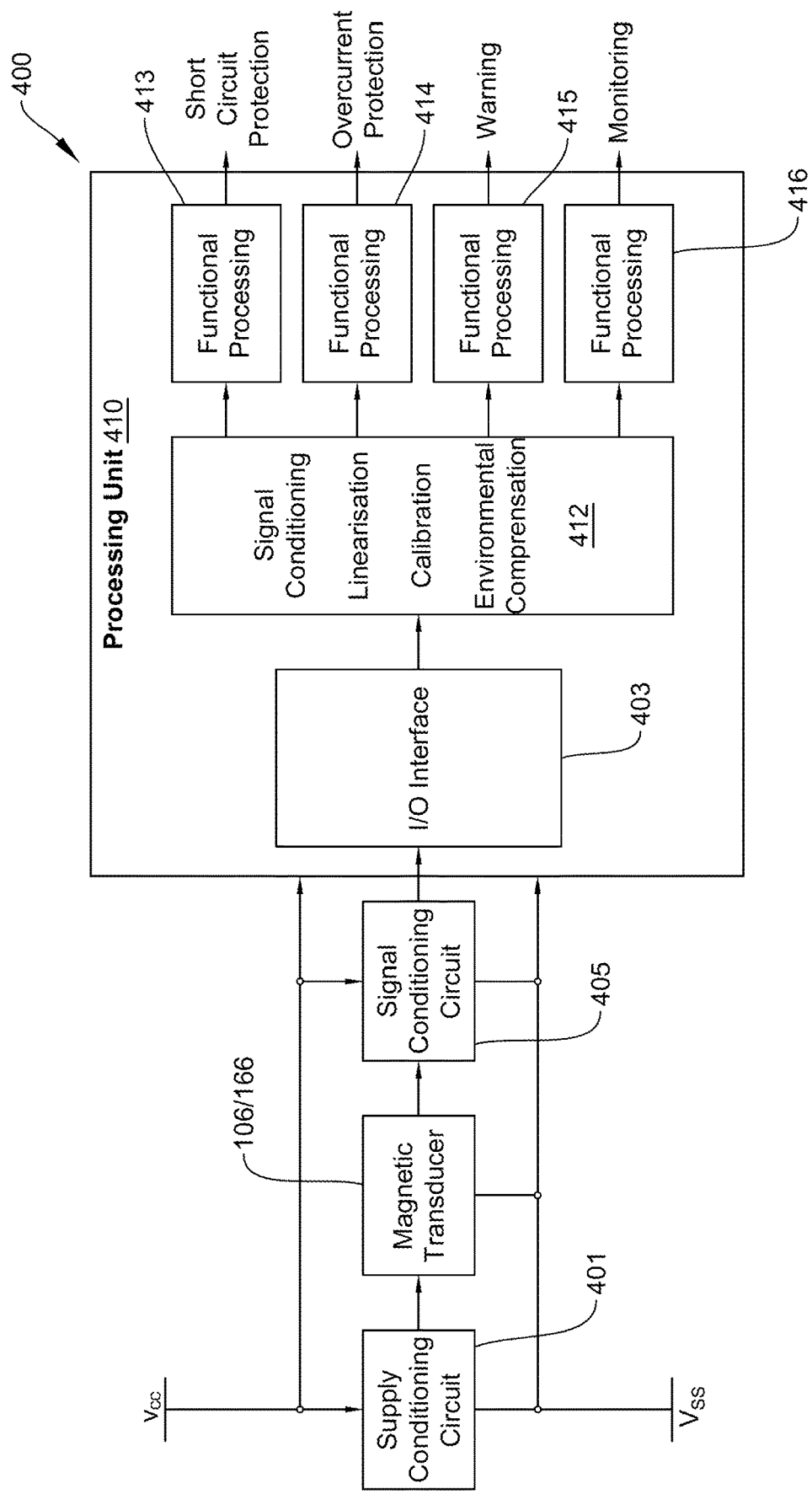
FIG. 10 is a block diagram illustrating a further embodiment of the present disclosure comprising a circuit, device or system incorporating a current detection device of any one of the embodiments of the present disclosure having a single output signal indicative of current or flux density.

Referring to FIG. 10, an embodiment of a device or system 400 (herein referred to as a device 400) is shown comprising a current detection device as described herein in relation to any of the embodiments of the present disclosure, e.g., 100, 100A or 160, where the magnetic field transducer 106/166 is configured to output a single electrical signal indicative of magnetic flux density or a combined (e.g., differential) magnetic flux density in a conductor coupled to the sensor. The current sensor structure may be as described in relation to any of the embodiments of the present disclosure, e.g., 100, 100A, or 160. The magnetic field transducer 106/166 is connected to a supply voltage, Vcc and to ground Vss. The device 400 may comprise a supply conditioning device 401 for regulating or otherwise conditioning the supply voltage for the current sensor. The output of the magnetic field transducer 106/166 may be electrically connected to one or more signal conditioning devices 405 which may comprise filters and/or amplifiers. An output of the signal conditioning device(s) may be electrically connected to an input of a signal processing device 410. The signal processing device 410 may comprise an input/output interface 403 for connecting to the output of the current sensor/transducer or the output of the signal conditioning device(s) 405, for instance. The input/output interface may comprise a digital to analogue converter, for instance. The signal processing device 410 may further comprise one or more processing units for performing other signal processing and conditioning functions 412 on the received transducer signal, including for instance: linearisation to adjust the transducer's output signal to make it linearly proportional to the strength of the magnetic field being measured, calibration to determine and adjust the transducer's response to match known reference values or standards, and/or adjusting the transducer's output to account for changes in environmental conditions, such as temperature or humidity, that can affect its performance. The functions 412 may be executable by the one or more processor(s) of the device 410 and prestored as instructions in electronic memory associated with or accessible by the processor(s). Some functions 412, such as linearisation, may also be based on predetermined data indicative of a linearised response, wherein the linearised response is predetermined from the non-linear response 300/300B/325 of the current sensor 100/100A/160. Linearisation may involve applying mathematical transformations or other signal processing techniques to the transducer's output signal, such as using look-up tables, polynomial functions, or piecewise linear approximations prestored in electronic memory of processing device 410, to create a linear relationship between the input signal and an output signal.

The processing device 410 may further be implemented to perform one or more other processing functions 413-416, to determine data indicative of an operating characteristic of the conductor, or a circuit or other electrical load connected to the conductor, based on the transducer's output signal. For example, the processing functions may determine one or more of: a short circuit condition in a circuit connected to the conductor, an overcurrent condition in a circuit connected to the conductor, and/or a data stream indicative of the changing current in the conductor for monitoring of circuit current, based on the data indicative of the current sensor output signal. One or more functions may generate one or more output signals, in the form of control signals based on the processing of the current sensor output, such as a warning or circuit disconnect signals. One or more functions may generate one or more signal or data streams, such as current readings, based on the processed current sensor output data that is indicative of the current sensor output signal. This data may be sent to one or more devices of the system 400 such as a communications or user interface device of the system 400 (not shown). Accordingly, the device 400 may be configured to perform one or multiple functions based on a signal indicative of the current sensor/magnetic field transducer output, and in some instances based on a magnitude of the current being detected, such as in the case of short circuit protection or overcurrent detection.

Figure 13A:
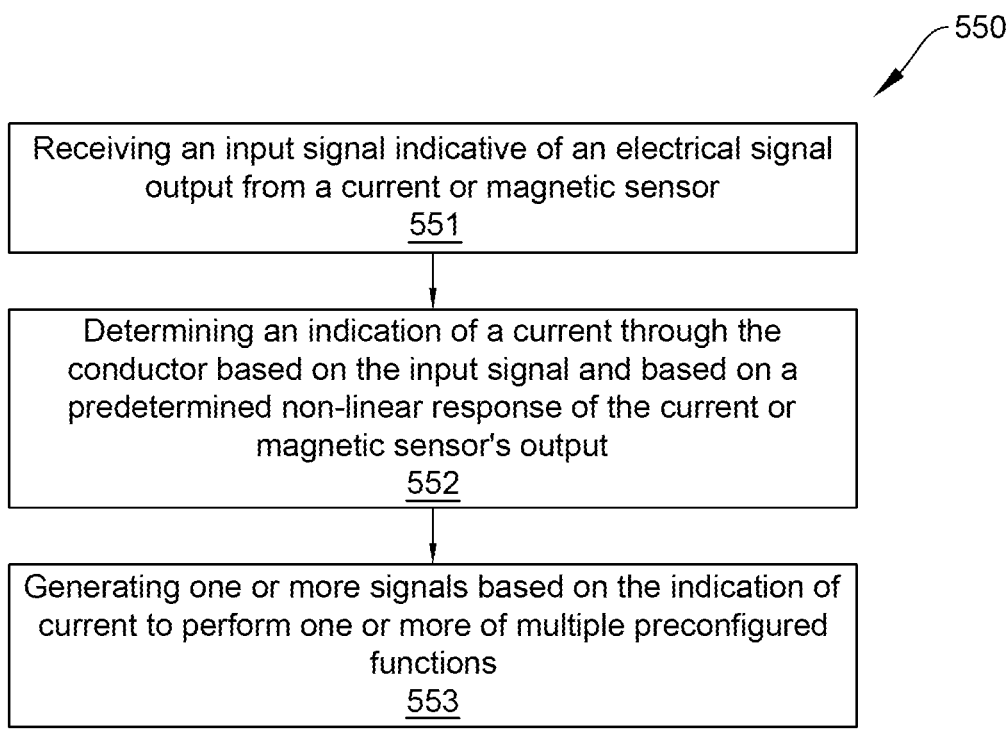
FIG. 13A is a flow diagram illustrating a further embodiment of the present disclosure comprising a method for detecting current or operating a device.

Referring to FIG. 13A, in an embodiment, the processing device 410 is operative in accordance with a method 550 for determining an indication of a current through a conductor 102 or for operating a device or system 400, the method 550 comprising the steps of: receiving an input signal indicative of an electrical signal output from a current or magnetic sensor 100/100A/160 (step 551), and determining an indication of a current through the conductor 102 based on the input signal and based on a predetermined response of the current or magnetic sensor's output signal to a current through a conductor coupled to the current or magnetic sensor 100/100A/160 (step 552). The predetermined response may be a substantially non-linear response and may further comprise any one or more of the features as described in relation to the response 300, 300B or 325 of current sensors 100, 100A and/or 160, or any other responses described herein such as response 325 relating to current sensors 100A and 160. The method 550 may further comprise, upon determining the indication of the current in the conductor, performing one of multiple preconfigured functions based on the current (step 553). The method may further comprise any one or more of the processing steps performed by the processing device 410 as described herein.

Figure 13B:
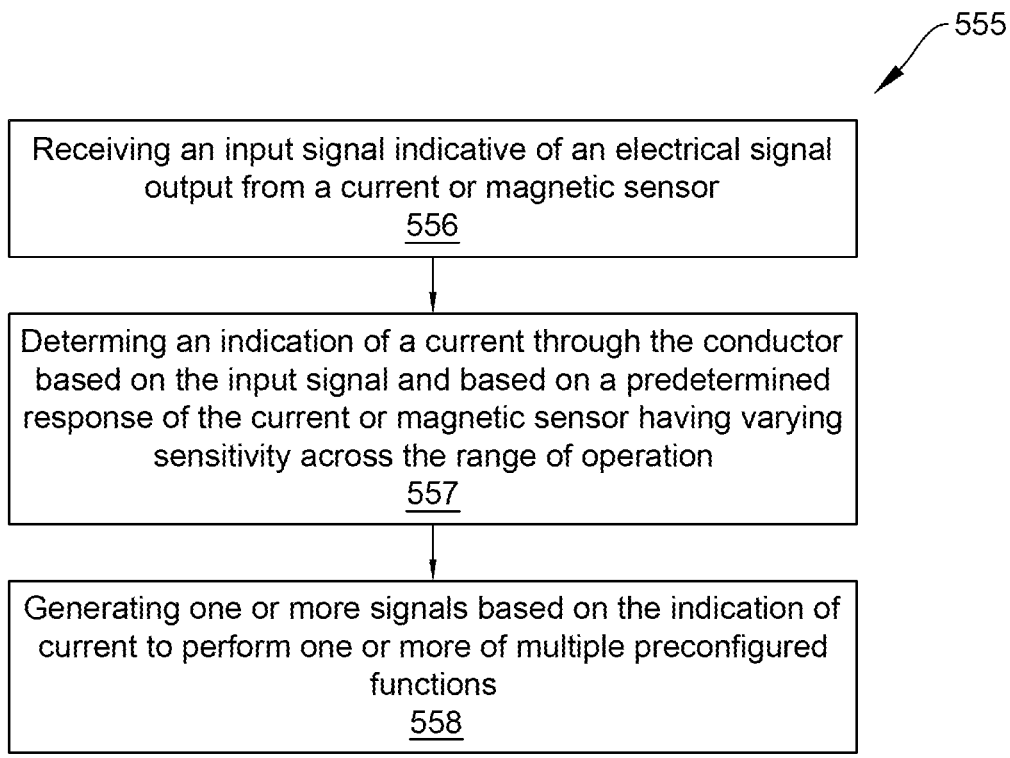
FIG. 13B is a flow diagram illustrating a further embodiment of the present disclosure comprising a method for detecting current or operating a device.

Referring to FIG. 13B, in an embodiment, the processing device 410 is operative in accordance with a method 555 for determining an indication of a current through a conductor 102 or for operating a device or system 400, the method 555 comprising the steps of: receiving an input signal indicative of an electrical signal output from a current or magnetic sensor 100/100A/160 (step 556), and determining an indication of a current through the conductor 102 based on the input signal and based on a predetermined response of the current or magnetic sensor's output signal to a current through a conductor coupled to the current or magnetic sensor 100/100A/160 (step 557). The predetermined response may comprise substantially a varying sensitivity across sensor's range of operation. The response may further comprise any one or more of the features as described in relation to the response 300, 300B or 325 of current sensors 100, 100A and/or 160, or any other responses described herein such as response 325 relating to current sensors 100A and 160. The method 550 may further comprise, upon determining the indication of the current in the conductor, performing one of multiple preconfigured functions based on the current (step 553). The method may further comprise any one or more of the processing steps performed by the processing device 410 as described herein.

Figure 11:
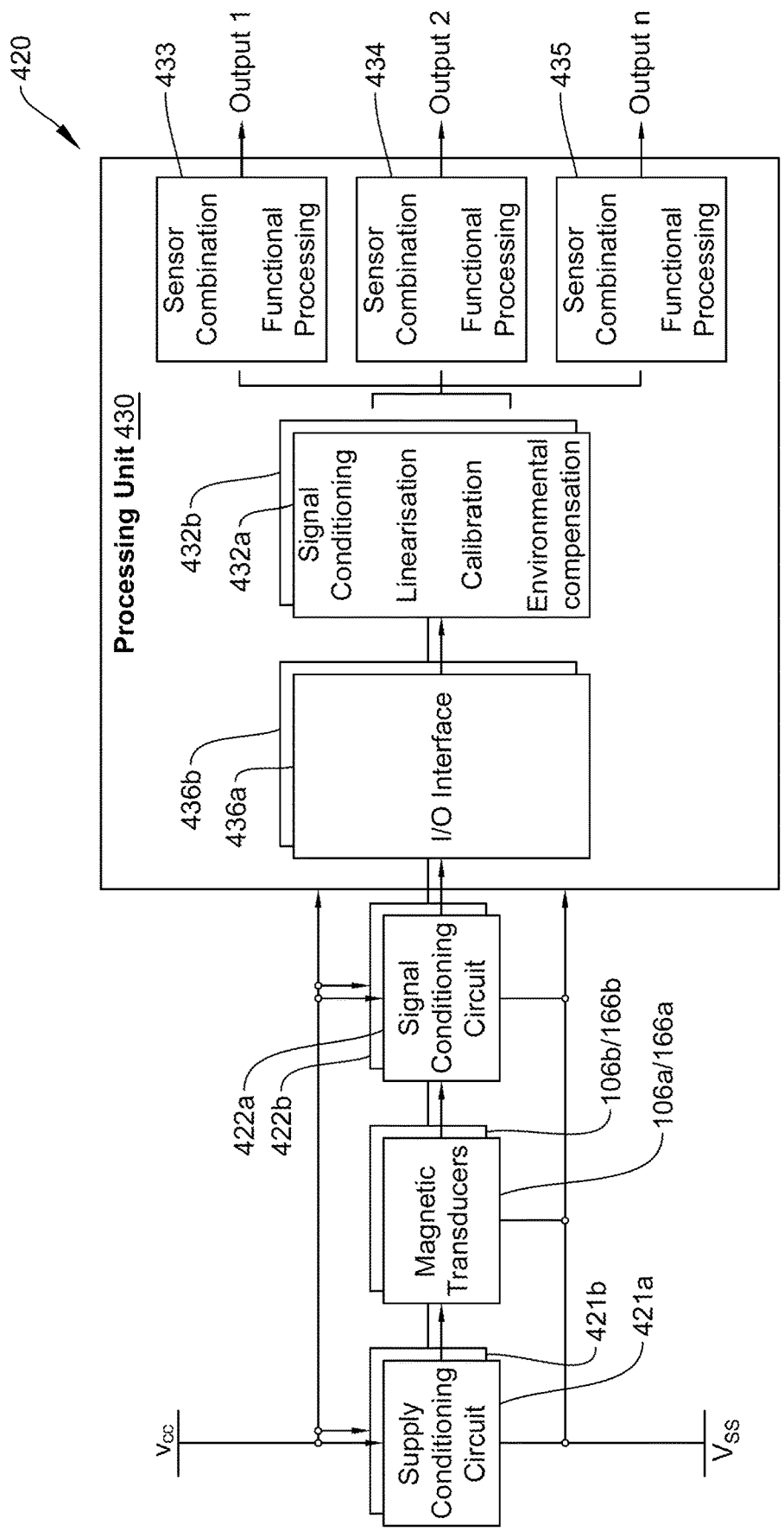
FIG. 11 is a block diagram illustrating a further embodiment of the present disclosure comprising a device or system incorporating a current detection device of any one of the embodiments of the present disclosure having multiple output signals indicative of current or flux density.

Referring to FIG. 11, an embodiment of a device or system 420 (herein referred to as a device 420) is shown comprising a current detection device as described herein in relation to any of the embodiments of the present disclosure, e.g., 100, 100A or 160A, where multiple magnetic field transducing devices 106*a,b*/166*a,b* are implemented in a current sensor and the current sensor is configured to output multiple distinct electrical signals corresponding to each of the magnetic field transducing devices 106*a,b*/166*a,b*. The current sensor structure may be as described in relation to any of the embodiments of the present disclosure, e.g., 100, 100A, or 160. The magnetic field transducers 106*a,b*/166*a,b* are each connected to a supply voltage, Vcc and to ground Vss. The device 420 may comprise a supply conditioning device(s) 421*a*, 421*b* for regulating or otherwise conditioning the supply voltage for the current sensor.

The outputs of the magnetic field transducers 106*a,b*/166*a,b* are each electrically connected to one or more signal conditioning devices 422*a*, 422*b* which may comprise filters and/or amplifiers for conditioning the signals prior to further processing. One or more signal conditioning devices may be implemented in analogue circuitry, and others implemented in digital circuitry. A signal processing device 430 of the circuit 420 may comprise input/output interfaces 436*a*, 436*b*, which may comprise analogue to digital converters, for receiving the signals indicative of each signal output from the magnetic field transducers 106*a,b*/166*a,b* and transforming the signals into digital data representative of the signals. One or more processing units 432*a*, 432*b* of the signal processing device 430 may be configured to receive the data indicative of the signals output from the transducers and perform other signal processing and conditioning functions on the data, including for instance: linearisation to adjust each transducer output signal to make it linearly proportional to the strength of the magnetic field being measured, calibration to determining and adjusting the transducer's response to match known reference values or standards, and/or adjusting the transducer's output to account for changes in environmental conditions, such as temperature or humidity, that can affect its performance. The functions or processing units 432*a*, 432*b* may be executable by the one or more processor(s) of the device 410 and prestored as instructions in electronic memory associated with or accessible by the processor(s). These are similar to the functions 412 described for system 400. Some functions, such as linearisation, may also be based on predetermined data indicative of a linearised response, wherein the linearised response is predetermined from data indicative of the non-linear response 300A, 300B of each transducer output. The processing device 430 may further be implemented to perform one or more other processing functions 433-435, to determine an operating characteristic of the conductor, or of a circuit or load connected to the conductor, based on the current sensor's output signals. For example, the processing functions may be configured to combine data indicative of the output signals to determine data indicative of a combined or differential signal, and accordingly detect a characteristic or condition of the conductor or an associated circuit or load based on the data indicative of the combined or differential signal. As mentioned, the data corresponding to each output signal of the current sensor may be separately linearised before being combined. Where the magnetic field transducing devices 106*a,b*/166*a,b* are configured to output signals of opposing polarities (with respect to the same magnetic field), the processing device 430 may be configured to combine the output signals to determine a differential measure of the magnetic flux density based on the output signals of the transducing devices 106a,b/166a,b. The processing device 410 may further comprise electronic memory having stored therein data indicative of the combined response (e.g., differential response 325) of the sensor outputs, or a linearised combined response (e.g., a linearised differential response), to accordingly determine an indication of the current in the conductor 102 based on the output signals from the transducing devices 106a,b/166a,b and the pre-stored combined response.

The functions 433-435 may be further configured to determine one or more of characteristics or conditions of the conductor or a circuit or load connected to the conductor, including for instance: a short circuit condition in a circuit connected to the conductor, an overcurrent condition in a circuit connected to the conductor, and/or a data stream indicative of the changing current in the conductor for monitoring of circuit current. Each function may generate one or more outputs as described in relation to device 400. This may be based on the data indicative of the combined or differential output signal relating to the multiple current sensor outputs. An exemplary application of any of the current sensor embodiments 100, 100A, 160 and/or devices or systems 400, 420 described herein, is described in PCT patent publication WO2022/018704, the contents of which are hereby incorporated by reference. This publication discloses an improved power distribution system that includes circuit protection modules having the dual functionality of electrical load monitoring and electrical load protection. Load monitoring may be used for analysing a load circuit during normal operation, and also controlling power distribution to one or more load circuits connected to the system. Load protection is for safety and protects the load circuit if there is an overload or short-circuit condition, for instance. In the application of a power distribution system, load monitoring may involve measuring and monitoring relatively low current levels, whereas load protection may involve measuring or acting upon relatively high or abnormally high current conditions.

Each of the abovementioned functions may require different sensor characteristics. For example, load monitoring preferably involves measurement of current with relatively high accuracy and resolution, meaning a current sensor with high sensitivity and a narrower operating range would be preferred. A high frequency response to measure current signatures may also be a desired aspect of the sensor. Load protection on the other hand requires a wide sensing range to allow for the measurement of relatively high currents. Immunity to external magnetic fields and magnetic noise from nearby busbars may also be a consideration for adequately implementing each of these functions. While it is possible to implement each function using a dedicated sensor that possesses the requisite characteristic for each function, using a single sensor has the potential to unlock significant benefits including, reduction in manufacturing costs, decrease in hardware footprint, and simplification of circuit implementation.

Figure 13C:
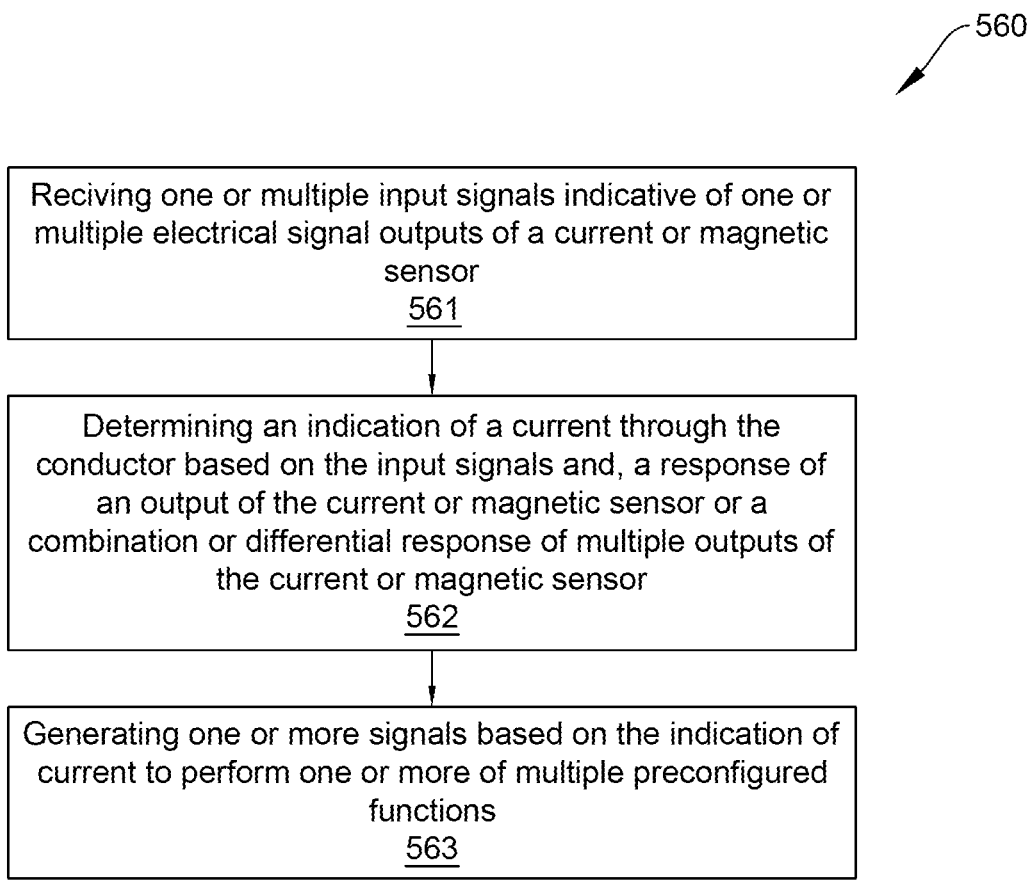
FIG. 13C is a flow diagram illustrating a further embodiment of the present disclosure comprising a method for detecting current or operating a device.

Referring to FIG. 13C, in an embodiment, the processing device 430 is operative in accordance with a method 560 for determining an indication of a current through a conductor 102 or for operating a device or system 420, the method 560 comprising the steps of: receiving one or multiple input signal(s) indicative of one or multiple electrical signal(s) output from a current or magnetic sensor 100/100A/160 (step 561), and determining an indication of a current through the conductor 102 based on the input signal(s) and, either a predetermined response of an output of the current or magnetic sensor (e.g., response 300 or 300B), or a predetermined response of a combination or differential of multiple outputs (e.g., response 325) of the current or magnetic sensor 100/100A/160 (step 562). Either predetermined response may be substantially non-linear and/or it may comprise substantially varying sensitivity across the sensor's full range of operation. The predetermined response may further comprise any one or more of the features as described in relation to any one of the responses 300, 300B or 325 of current sensors 100, 100A and/or 160. The method 560 may further comprise, upon determining the indication of the current in the conductor, performing one of multiple preconfigured functions based on the current (step 563). The method 560 may further comprise any one or more of the processing steps performed by the processing device 430 as described herein.

Figure 12:
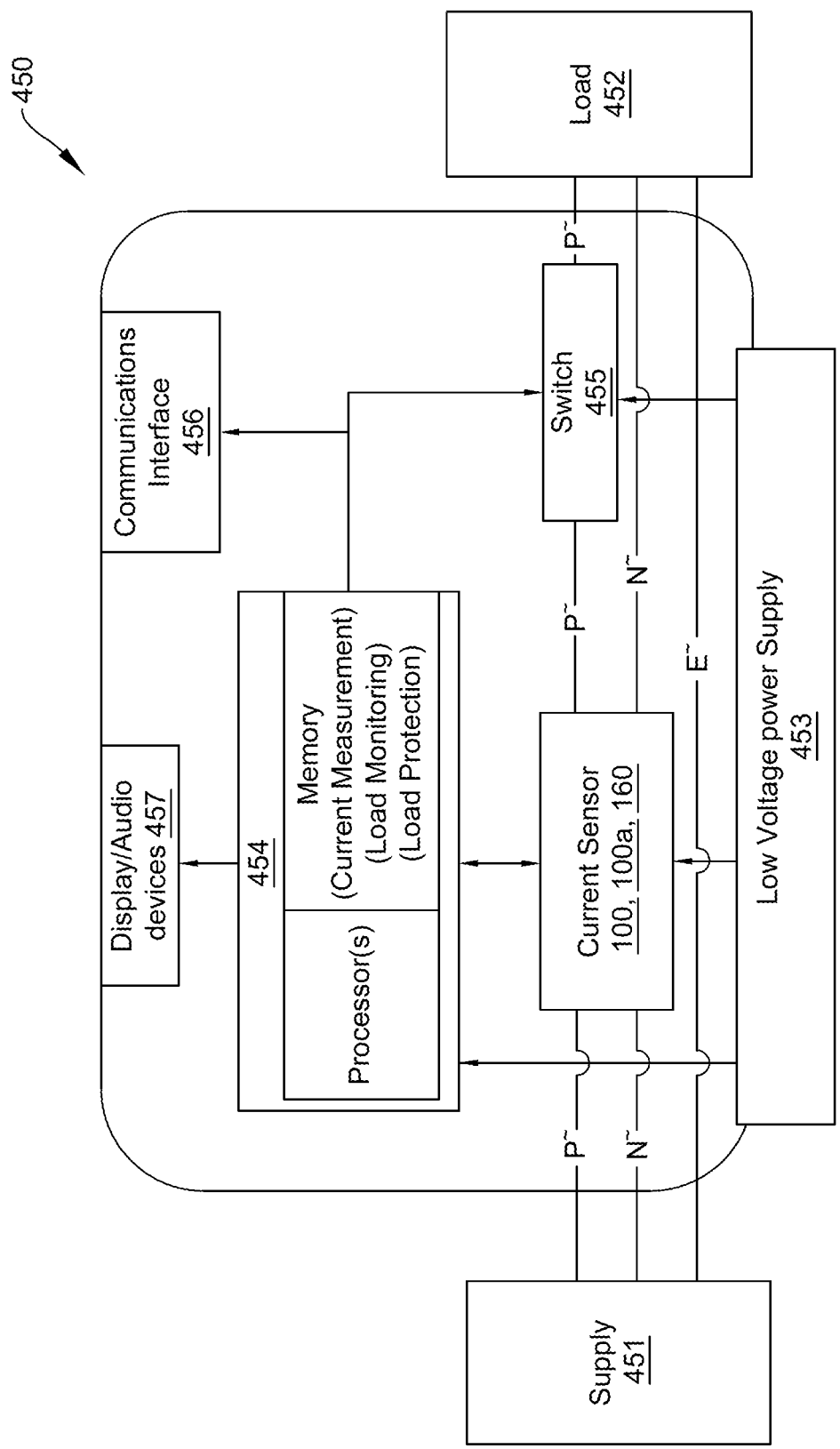
FIG. 12 is a block diagram illustrating a further embodiment of the present disclosure comprising a circuit, device or system incorporating a current detection device of any one of the embodiments of the present disclosure.

Referring to FIG. 12, an embodiment of a circuit protection device or system 450 of a power distribution panel, as described in the abovementioned publication for instance, is shown. The circuit protection device or system 450 comprises circuitry that is operable to interrupt the flow of current through a connected sub-circuit or load when certain conditions are met, and to reinstate the flow of current when it is safe to do so. Such conditions for interrupting current flow may comprise preconfigured fault conditions associated with the connected sub-circuit or load. The device or system 450 may be further configured to perform one or more other function(s) including for instance: monitoring one or more electrical parameters associated with the sub-circuit or load (such as current(s) and/or voltage(s)), and/or analysing electrical parameters to determine one or more operational conditions, such as an overcurrent, an arc fault or an excess residual current/ground fault condition. Exemplary sub-circuit protection devices configured to perform such functions are described in PCT patent application publication no. WO2022/018704, the contents of which are hereby incorporated by reference.

The device or system 450 comprise power input connections for electrically coupling to phase (and optionally neutral) power distribution lines of the panel 100, and optionally also an earth line of a power distribution system. The power input connections are preferably configured to electrically connect to a power source supply 451. The system 450 may further comprise at least a voltage power supply circuit or system 453, herein referred to as an extra-low-voltage (ELV) power supply. The ELV power supply 453 comprises a voltage input and a voltage out, and is configured to convert a higher voltage input, which may be received from the supply 451 into a target lower voltage output that is safe for powering low voltage devices of the system, such as controllers and other peripheral devices. The target output voltage may be lower than 50 Vac, or 125 Vdc, for instance. However, it will be appreciated these ranges are only exemplary and not intended to be limiting. In an embodiment, an ELV power supply 453 is configured to output a target voltage of approximately 12 Vdc. The ELV power supply 453 may comprise any suitable electrical components required to convert a higher voltage AC or DC input supply to a lower AC or DC output voltage, as is well understood in the art. For instance, the ELV power supply 453 may comprise an isolating and step-down transformer, having a primary winding connected between the phase and neutral lines for stepping down the input voltage, rectifier(s) for converting AC voltage to DC, filter(s) for smoothing out the output voltage, and/or voltage regulator(s) for regulating the output voltage and ensuring it remains stable and within desired voltage range.

The device or system 450 further comprises a load connection for electrically connecting to a sub-circuit or load 452 to deliver a voltage to the sub-circuit or load. Electrical current enters the device or system 450 via the phase connection at the input power side, exit via the phase connection at the load side, and return to the device or system 450 via the neutral connection at the load side and exit the device or system 450 at the neutral connection at the power input side.

In some configurations, the load side connection may be configured or utilised as an input such as when the device or system 450 is connected to an external power source, e.g., a renewable energy system or an electrical power storage device. In such a configuration the power or voltage input connection may be configured or utilised as a power or voltage output connection, and the direction of electrical current flow may be reversed to the flow mentioned above when the output connection is configured as an input.

The device or system 450 further comprises a current detection device 100/100A/160 as described herein configured to measure current in a current flow path between the power input side and load side of the device or system 450, and output one or more electrical signals or data indicative of the measured current or magnetic flux density (as described above). The current sensor 100/100A/160 comprises a current sensing range that is suitable for general load monitoring, as well as fault detection or safety functionality, for instance.

The device or system 450 further comprises one or more electrical current flow interrupting or controlling devices (e.g., a disconnection means 455) electrically coupled to the current flow path between the power input side and load side of the device or system 450. The current flow interrupting device 455 may be electrically connected to the phase line and operable to interrupt the current flow path between the power input side and the load side in an open state of the device 455, and to permit the flow of current therethrough in a closed state of the device 455.

The device or system 450 further comprises a controller 454 comprising one or more processing components (herein: processor(s)) and associated electronic storage medium or media (herein: electronic storage). The controller 454, current detection device 100/100A/160 and flow interrupting device 455 are preferably each electrically connected to an input power supply, such as the ELV power supply 453.

The electronic storage of controller 454 may store instructions and other associated data to be executed by the processor(s). The electronic storage may comprise a single medium or multiple media which may or may not be physically closely associated with one another. Similarly, the processor(s) may comprise a single processor, or multiple processor(s) which may or may not be physically closely associated with one another. Collectively, the processor(s) and the storage medium or media are configured or configurable, and operable, to perform the function(s) of the controller 454 described herein.

The electronic storage may comprise a non-volatile or non-transitory storage medium or media for storing instructions or other data that is intended to remain accessible by the processor(s) when the controller 454 is deactivated and then reactivated again. The electronic storage may further comprise a volatile or transitory storage medium or media for temporary storage of data while the controller 454 is activated. This data is intended to be deleted from the temporary storage before or when the controller 454 is deactivated, e.g., when power to the device or system 450 is disconnected.

The current detection circuit 100, 100A, 160 is electrically coupled to the phase bus bar of the device or system module 450, for instance, to measure an indication of the current through the busbar. The busbar may comprise or connect to conductor 102, 161, for instance. The controller 454, having one or more processor(s) and electronic memory associated therewith, is coupled to one or more output(s) of the current sensor 100, 100A, 160 and is configured to determine an indication of the current through the busbar based on the predetermined response of the sensor, and then accordingly may generate one or more outputs for performing one or more functions of the system 450. The controller 454 may be configured to perform any one or more of the functions described in relation to processing devices 410 or 430 of device/system 400 or 420, for instance.

The controller 454 may be configured to perform one or more sub-circuit monitoring, detection and/or protection function(s). The functions may be pre-configured. The pre-configured function(s) may comprise load monitoring, fault detection function(s) and/or sub-circuit protection functions. For instance, a fault detection function may analyse received current sensor data indicative of the output signal(s) from the device 100/100A/160 and accordingly determine if a fault condition exists based on the received data. The fault condition may be based on a pre-configured threshold condition or criteria associated with one or more operational parameter(s), e.g., current and/or voltage. The controller 454 may be further configured to perform sub-circuit protection function(s) by controlling the current flow interrupting device 455 to disconnect the power input side from the load side when a preconfigured condition, such as a preconfigured fault condition, is determined or detected, for instance. The disconnection may be instantaneous, such as in a short-circuit case, where the disconnect means 455 is instantaneously actuated by the controller 454 when a large current is detected, and/or it could be time based, such as when an overcurrent is detected for a predetermined duration.

As used herein, the term "fault" could include any of a variety of conditions for which it may be desirable/necessary for the device or system 450 to disconnect the power input connection from the load connection. For example, "fault" may be a fault within the sub-circuit protection device itself, a fault on the load side, a fault on the power input side, or the like. A "fault" may be a residual current/ground fault, an arc fault, an overcurrent fault, or the like.

The pre-configured fault detection and/or the sub-circuit protection function(s) may be executable by controller 454 during operation, based on pre-set configuration data stored in memory and accessible by controller 454. For example, the configuration data may comprise instructions for performing one or more fault detection function(s). This could be instruction(s) for performing one or more of: overcurrent detection and/or short circuit protection. The configuration data may also comprise one or more threshold conditions or criteria relating to one or more operating parameter(s) for identifying or detecting a fault condition. The operating parameter(s) associated with a particular fault condition may comprise any combination of electrical characteristics, including for example: current amplitude, a frequency of the current, a duration of an overcurrent condition, an indication of a thermal energy associated with an electrical event, an $i^2t$ duration, etc. Such parameters may be derivable from data indicative of the output signal(s) of the current sensor 100/100A-160. Other parameters may be implemented for detecting a fault condition as would be apparent to those skilled in the art.

For instance, the configuration data may comprise instructions to determine an overcurrent fault condition by: 1) receiving data indicative of current amplitude (e.g., from a sensor 100/100A/160, and 2) determining if a maximum or average current between the power input side and load side exceeds a threshold defined by the pre-set configuration data.

As another example, the configuration data may comprise instructions for interrupting a flow of current between the power input side and the load side when one or more preconfigured fault condition(s) are detected. The controller 454 may be operable to interrupt a flow of current by sending a trip control signal to the current flow interrupting device 455 based on detection of a fault condition.

In some embodiments, the current flow interrupting device 455 may be electrically connected to both the phase line and the neutral line of the device or system 450. The current flow interrupting device 455 may be a solid-state device.

The controller 454 may further generate one or more output signals to external devices configured to monitor and/or analyse the current, such as during normal operation to determine one or more signatures of the connected load circuits. These outputs may also be generated and sent via a communications interface 456 of the system 450. The communications interface 456 may exchange data between the device or system 450 and another external device or system, such as remote user devices, remote servers, remote databases, and/or networks. The communications interface 456 may comprise a wireless communications interface comprising wireless technology configured to communicate with remote computing device(s) via a wireless communication channel (e.g., a short-range wireless/near field wireless technology, Bluetooth®, Wi-Fi, ZigBee®, etc.). The wireless communication components of the communication interface 456 may include radio transmitting and receiving circuitry, an antenna, and a processor for instance, configured to communicate using a wireless transmission scheme, such as, for example, BLE. The wireless communication interface 456 may be operable to communicate over a number of wireless frequencies or schemes. As such, the processor, radio and antenna of the communications interface 456 could be configured to communicate over multiple wireless communication technologies, such as, for example, BLE and Wi-Fi.

The communications interface 456 may alternatively or in addition comprise an interface for wired communication with one or more remote computing device(s). The wired communications interface may comprise any wired communication technology (e.g., Ethernet, CANbus, RS232, USB, or the like).

One or more indicator(s), display and/or audio devices 457 may also be implemented in the device or system 450. The controller 454 may be configured to send control signals to these device(s) 457 based on the output signal(s) of the current sensor 100, 100A, 160, for a user of the system 450 to observe certain characteristics of the system or circuit 450, such as warning audio signals in the case of a fault condition, or display of current flowing through the busbar or power used by the load circuit.

The communications interface 456 and the one or more display, audio and/or indicator device(s) 457 may also be electrically connected to the ELV supply 453.

While the system 450 is shown as a three-phase alternating current system it will be appreciated that the system 450 could be a single phase alternating current or a direct current system, and still operate in accordance with the description above. Such variations are not intended to be excluded from the scope of protection.

The above is an example of one electrical device or system which may utilise the varied sensitivity and extended operating range of the current sensor 100/100A/160 to perform multiple functions. Other similar applications or electrical systems could make use of a similar sensor as described herein including, for instance, battery management and control application, motor control for appliances and machinery, industrial process control applications, electric vehicles (EV) systems, and power converters. Such implementations are not intended to be excluded from the scope of protection as would be apparent to a person skilled in the art.

Embodiments described herein may be implemented by hardware, software, firmware, middleware, microcode, or any combination thereof. When implemented in software, firmware, middleware or microcode, the program code or code segments to perform the necessary tasks may be stored in a machine-readable medium such as a storage medium or other storage(s). A processor may perform the necessary tasks. A code segment may represent a procedure, a function, a subprogram, a program, a routine, a subroutine, a module, a software package, a class, or any combination of instructions, data structures, or program statements. A code segment may be coupled to another code segment or a hardware circuit by passing and/or receiving information, data, arguments, parameters, or memory contents. Information, arguments, parameters, data, etc. may be passed, forwarded, or transmitted via any suitable means including memory sharing, message passing, token passing, network transmission, etc.

In the foregoing, an electronic storage medium may represent one or more devices for storing data, including read-only memory (ROM), random access memory (RAM), magnetic disk storage mediums, optical storage mediums, flash memory devices and/or other machine-readable mediums for storing information. The terms "machine readable medium" and "computer readable medium" include, but are not limited to portable or fixed storage devices, optical storage devices, and/or various other mediums capable of storing, containing or carrying instruction(s) and/or data.

The various illustrative logical blocks, modules, circuits, elements, and/or components described in connection with the examples disclosed herein may be implemented or performed with a general purpose processor, a digital signal processor (DSP), an application specific integrated circuit (ASIC), a field programmable gate array (FPGA) or other programmable logic component, discrete gate or transistor logic, discrete hardware components, or any combination thereof designed to perform the functions described herein. A general-purpose processor may be a microprocessor, but in the alternative, the processor may be any conventional processor, controller, microcontroller, circuit, and/or state machine. A processor may also be implemented as a combination of computing components, e.g., a combination of a DSP and a microprocessor, a number of microprocessors, one or more microprocessors in conjunction with a DSP core, or any other such configuration.

The methods or algorithms described in connection with the examples disclosed herein may be embodied directly in hardware, in a software module executable by a processor, or in a combination of both, in the form of processing unit, programming instructions, or other directions, and may be contained in a single device or distributed across multiple devices. A software module may reside in RAM memory, flash memory, ROM memory, EPROM memory, EEPROM memory, registers, hard disk, a removable disk, a CD-ROM, or any other form of storage medium known in the art. A storage medium may be coupled to the processor such that the processor can read information from, and write information to, the storage medium. In the alternative, the storage medium may be integral to the processor.

One or more of the components and functions illustrated in the figures may be rearranged and/or combined into a single component or embodied in several components without departing from the present disclosure. Additional elements or components may also be added without departing from the present disclosure. Additionally, the features described herein may be implemented in software, hardware, as a business method, and/or combination thereof.

In its various aspects, the present disclosure can be embodied in a computer-implemented process, a machine (such as an electronic device, or a general-purpose computer or other device that provides a platform on which computer programs can be executed), processes performed by these machines, or an article of manufacture. Such articles can include a computer program product or digital information product in which a computer readable storage medium containing computer program instructions or computer readable data stored thereon, and processes and machines that create and use these articles of manufacture.

The foregoing description of the present disclosure includes preferred forms thereof. Modifications may be made thereto without departing from the scope of the present disclosure as defined by the accompanying claims.

The invention claimed is:

1. A current detection device for measuring current flowing through a conductor, the current detection device comprising:
   a magnetic core having a channel for receiving the conductor therethrough; and
   a magnetic field transducer positioned at least partially within an air gap of the magnetic core, and configured to respond to the presence of a magnetic field by generating an output electrical signal based on a flux density of the magnetic field;
   wherein the magnetic core comprises an absolute saturation flux density that is substantially lower than an absolute saturation flux density of the magnetic field transducer.

2. The current detection device of claim 1, wherein:
   the magnetic field transducer comprises a magnetic flux density operating range defined by a minimum saturation flux density and a maximum saturation flux density, beyond which the generated output electrical signal of the magnetic field transducer is substantially saturated; and
   a response of the current detection device within the magnetic flux density operating range varies in sensitivity, the response of the current detection device being a response of the output electrical signal in response to a current in the conductor.

3. The current detection device of claim 2, wherein the response of the current detection device is preconfigured.

4. The current detection device of claim 2, wherein a sensitivity of the current detection device is substantially higher in a lower magnetic flux density response zone relative to a higher magnetic flux density response zone, within the operating range of the magnetic field transducer.

5. The current detection device of claim 2, wherein a response of the current detection device within the operating range comprises a substantially non-linear response zone.

6. The current detection device of claim 5, wherein the non-linear response zone is a substantially curved response zone.

7. The current detection device of claim 5, wherein the response of the current detection device further comprises a substantially linear, lower response zone, below a minimum absolute flux density of the non-linear response zone.

8. The current detection device of claim 5, wherein the response of the current detection device further comprises a substantially linear, upper response zone above a maximum absolute flux density of the non-linear response zone.

9. The current detection device of claim 8, wherein the upper response zone is below the absolute saturation flux density of the magnetic field transducer.

10. The current detection device of claim 1, wherein the absolute saturation flux density of the magnetic core is less than approximately 50% of the absolute saturation flux density of the magnetic field transducer.

11. The current detection device of claim 1, wherein the magnetic core comprises a nanocrystalline material or materials.

12. The current detection device of claim 1, wherein the magnetic core comprises a substantially U-shaped cross-section.

13. The current detection device of claim 1, wherein the air gap locates between two opposing walls of the magnetic core, at an open end or side of the magnetic core.

14. The current detection device of claim 13, wherein a distance between two opposing inner walls of the magnetic core at the air gap is substantially uniform across a region of the air gap containing the magnetic field transducer.

15. The current detection device of claim 1, wherein the magnetic field transducer comprises at least two closely associated magnetic field transducing devices or elements located within the air gap, and wherein the magnetic field transducing devices or elements are configured to be exposed to a same or similar input magnetic flux density.

16. The current detection device of claim 1, wherein the magnetic field transducer comprises at least two magnetic field transducing devices or elements located within the air gap, and wherein each magnetic field transducing device has a different absolute saturation flux density.

17. The current detection device of claim 16, wherein each magnetic field transducing device comprises a different sensitivity with respect to an output electrical signal generated by the magnetic field transducing device, in the presence of a magnetic field.

18. The current detection device of claim 1, wherein the magnetic field transducer comprises at least one pair of magnetic field transducing devices or elements oriented to output electrical signals having opposing polarities with respect to the direction of a common magnetic field.

19. The current detection device of claim 1, further comprising a measurement device configured to receive at least one input electrical signal indicative of at least one output of the magnetic field transducer, and to determine an indication of a current in the conductor based on the received electrical signal(s).

20. The current detection device of claim 19, wherein the measurement device is configured to determine an indication of a differential current signal indicative of a differential magnetic flux density sensed by a pair of magnetic field transducers or elements of the magnetic field transducer based on the input electrical signal(s).

21. The current detection device of claim 19, wherein the measurement device is configured to determine data indicative of the current in the conductor based on a predetermined, non-linear response of the current detection device having at least one curved response component.

22. A device, comprising:
the current detection device of claim 1, configured to output an electrical signal indicative of a current through a conductor; and
a controller configured to receive an input signal indicative of the electrical signal output from the current detection device, and to generate an indication of a current through the conductor based on the input signal(s) and based on a predetermined response of the output signal from the current detection device in response to current flowing through the conductor.

23. The device of claim 22, wherein:
the magnetic field transducer comprises a magnetic flux density operating range defined by a minimum saturation flux density and a maximum saturation flux density, beyond which the generated output electrical signal of the magnetic field transducer is substantially saturated; and
the response comprises a varying sensitivity across the flux density operating range of the current detection device.

24. The device of claim 22, wherein the device is configured to perform one of multiple functions based on the indication of the current through the conductor.

25. The device of claim 24, wherein the multiple functions comprise a first function that is a circuit monitoring function in which the device is configured to store or transmit data indicative of the output electrical current.

26. The device of claim 25, wherein the device further comprises an electrical current flow path configured to connect to a source of electrical power and to an electrical load, and wherein the device is configured to store or transmit data indicative of current flowing through the current flow path based on the electrical signal output from the current detection device.

27. The device of claim 25, wherein the multiple functions comprise a second function that is a protective function in which the device is configured to send a safety control signal based on the indication of the current through the conductor.

28. The device of claim 27, further comprising an electrical current flow path configured to connect between a source of electrical power and an electrical load, and a disconnect means electrically connected to the electrical current flow path, and wherein the safety control signal is configured to actuate the disconnect means to open the electrical current flow path.

29. The device of claim 22, wherein the response of the current detection device comprises a differential response of multiple magnetic field transducers or elements of the current detection device.

* * * * *